US008566671B1

(12) United States Patent
Ye et al.

(10) Patent No.: US 8,566,671 B1
(45) Date of Patent: Oct. 22, 2013

(54) CONFIGURABLE ACCELERATED POST-WRITE READ TO MANAGE ERRORS

(75) Inventors: Jia Ye, San Jose, CA (US); Mrinal Kochar, San Jose, CA (US); Jianmin Huang, San Carlos, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/538,927

(22) Filed: Jun. 29, 2012

(51) Int. Cl.
*G11C 29/00* (2006.01)

(52) U.S. Cl.
USPC .......................................................... 714/764

(58) Field of Classification Search
USPC .......................................................... 714/764
See application file for complete search history.

(56) References Cited

U.S. PATENT DOCUMENTS

| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,321,699 A | 6/1994 | Endoh et al. |
| 5,343,063 A | 8/1994 | Yuan et al. |
| 5,386,422 A | 1/1995 | Endoh et al. |
| 5,469,444 A | 11/1995 | Endoh et al. |
| 5,570,315 A | 10/1996 | Tanaka et al. |
| 5,595,924 A | 1/1997 | Yuan et al. |
| 5,602,789 A | 2/1997 | Endoh et al. |
| 5,661,053 A | 8/1997 | Yuan |
| 5,768,192 A | 6/1998 | Eitan |
| 5,859,795 A | 1/1999 | Rolandi |
| 5,867,429 A | 2/1999 | Chen et al. |
| 5,903,495 A | 5/1999 | Takeuchi et al. |
| 5,930,167 A | 7/1999 | Lee et al. |
| 6,011,725 A | 1/2000 | Eitan |
| 6,046,935 A | 4/2000 | Takeuchi et al. |
| 6,134,140 A | 10/2000 | Tanaka et al. |
| 6,141,388 A | 10/2000 | Servais et al. |
| 6,222,762 B1 | 4/2001 | Guterman et al. |
| 6,456,528 B1 | 9/2002 | Chen |
| 6,914,823 B2 | 7/2005 | Chen et al. |
| 6,917,542 B2 | 7/2005 | Chen et al. |

(Continued)

FOREIGN PATENT DOCUMENTS

EP        709782 A2    5/1996

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

*Primary Examiner* — Ajay Bhatia
*Assistant Examiner* — Thien D Nguyen
(74) *Attorney, Agent, or Firm* — Davis Wright Tremaine LLP

(57) ABSTRACT

Data errors in non-volatile memory inevitably increase with usage and with higher density of bits stored per cell. The memory is configured to have a first portion operating with less error but of lower density storage, and a second portion operating with a higher density but less robust storage. An error management provides reading and checking the copy after copying to the second portion. If the copy has excessive error bits, it is repeated in a different location either in the second or first portion. The reading and checking of the copy is accelerated by reading only a sample of it. The sample is selected from a subset of the copy having its own ECC, where the sample selected depends on the count of erase-program cycles that a block has experienced, where different count ranges can use different samples.

32 Claims, 33 Drawing Sheets

(56) References Cited

U.S. PATENT DOCUMENTS

| | | |
|---|---|---|
| 7,177,184 B2 | 2/2007 | Chen |
| 7,376,011 B2 | 5/2008 | Conley et al. |
| 7,554,842 B2 | 6/2009 | Barzilai et al. |
| 7,864,578 B2 | 1/2011 | Takada |
| 8,094,500 B2 | 1/2012 | Paley et al. |
| 8,214,700 B2 | 7/2012 | Chen |
| 2004/0109357 A1 | 6/2004 | Cernea et al. |
| 2005/0068802 A1 | 3/2005 | Tanaka |
| 2007/0263469 A1* | 11/2007 | Cornwell et al. ............. 365/226 |
| 2008/0112238 A1 | 5/2008 | Kim et al. |
| 2008/0177956 A1 | 7/2008 | Peddle |
| 2009/0190397 A1 | 7/2009 | Cho et al. |
| 2009/0327591 A1 | 12/2009 | Moshayedi |
| 2010/0131809 A1 | 5/2010 | Katz |
| 2011/0035538 A1 | 2/2011 | Kim et al. |
| 2011/0096601 A1* | 4/2011 | Gavens et al. ........... 365/185.09 |
| 2011/0099418 A1 | 4/2011 | Chen |
| 2011/0099460 A1 | 4/2011 | Dusija et al. |
| 2011/0149651 A1 | 6/2011 | Gorobets et al. |
| 2011/0153912 A1 | 6/2011 | Gorobets et al. |
| 2011/0161784 A1 | 6/2011 | Selinger et al. |
| 2011/0173378 A1 | 7/2011 | Filor et al. |
| 2012/0311244 A1 | 12/2012 | Huang et al. |

* cited by examiner

Programming into two states represented by a 1-bit code

Programming into four states represented by a 3-bit code

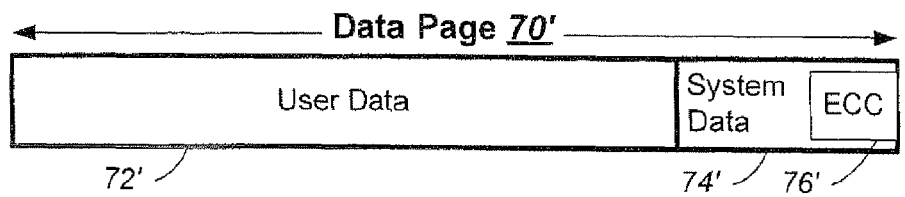
FIG. 9
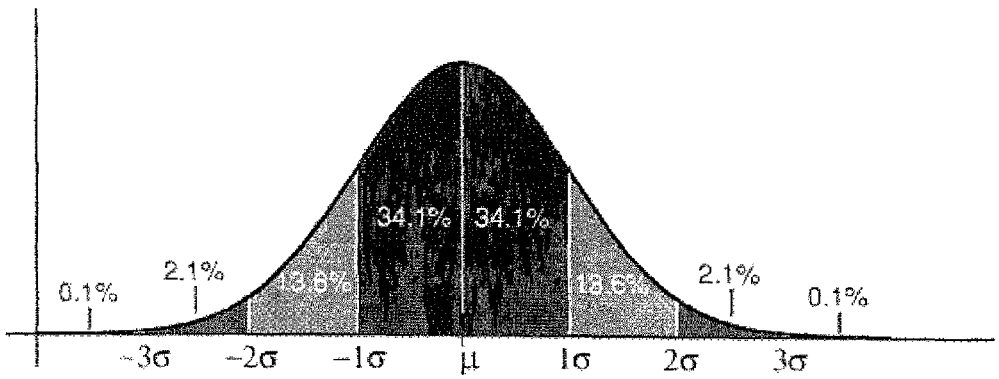
FIG. 10A
| Sigma Value | Cumulative value | Cumulative % | Example Error Rate at EOL |
|---|---|---|---|
| 1σ | 1.59E-01 | 15.86500000% | ... |
| 1.645σ | 5.00E-02 | 5.00000000% | 1 bits |
| 1.960σ | 2.50E-02 | 2.50000000% | ... |
| 2σ | 2.28E-02 | 2.27500000% | 2 bits |
| 2.576σ | 5.00E-03 | 0.50000000% | ... |
| 3σ | 1.35E-03 | 0.13500000% | 4 bits |
| 3.2906σ | 5.00E-04 | 0.05000000% | ... |
| 4σ | 3.17E-05 | 0.00316700% | 8 bits |
| 5σ | 2.87E-07 | 0.00028670% | 30 bits |
| 6σ | 9.86E-10 | 0.00000010% | 42 bits |
| 7σ | 1.28E-12 | 0.00000000% | ... |
FIG. 10B

| | ERROR SOURCE | DESCRIPTION |
|---|---|---|
| (A) | $E_{PW}(N_{CYC})$ | Bit errors that are present soon after the page is written. They increase with $N_{CYC}$, the number of program-erase cycling, which is a measure of the endurance of a block. |
| (B) | $E_{DR}(T, N_{CYC})$ | Bit errors due to data retention at EOL ("end of life") T = Temperature |
| (C) | $E_{RD}(N_R, N_{CYC})$ | Bit errors due to read disturb which increase with the number of reads $N_R$ and endurance |

*FIG. 11*

| | | |
|---|---|---|
| (A) | $E_{TOT}(N_{CYC}, N_R)$ | $= E_{PW}(N_{CYC}) + E_{DR}(T, N_{CYC}) + E_{RD}(N_R, N_{CYC})$ |
| (B) | (fresh after 1 year) $E_{TOT}(1, 1M)$ | $E_{PW}(N_{CYC}) + E_{DR}(85°C, 1) + E_{RD}(1M, 1)$ $= 3 + 2 + 0 = 5$ bits |
| (C) | (memory at EOL) $E_{TOT}(10K, 1M)$ | $E_{PW}(10K) \sim 10$, $E_{DR}(85°C, 10K) \sim 10$, and $E_{RD}(1M, 10K) \sim 1$ $= 10+10+1 = 21$ bits |

Examples of Total Errors at the beginning and end of life

*FIG. 12*

| | |
|---|---|
| $ECC_{DESIGN}$ | Must be designed to correct for worst case $E_{TOT}$(after EOL cycling, Data Retention specification) |

*FIG. 13*

MEMORY ARRAY 200

Second Portion 420
(*less robust but higher density storage*)

▰▰▰ first copy of data page ▰▰▰

First Portion 410
(*more robust but lower density storage*)

Second Section 412 (*for rewrites*)

First Section 411 (*for caching*)

▰▰▰ cached copy of data page ▰▰▰

WRITE

Input data page

*FIG. 16A*

Example of successful D1 to D3 Folding

Example of Read Error after 1st D1 to D3 Folding

Example of Read Error after 2nd D1 to D3 Folding

File System Configuration File

| PARAMETER | DESCRIPTION |
| --- | --- |
| E_pw_check | a variable set in File System Configuration File to specify at what # of ECC bits level, a D3 block is consider high risk and restart of D1 to D3 folding to a new D3 block is required |
| ECC_threshold_SLC | a variable is needed in File System Configuration File for maintaining SLC threshold to compare against in order to make a decision to continue with EPWR or not |
| EPWR_enable_flag | controlled in File System Configuration File.<br>0 = not set (Default);<br>1 = set when EPWR is enabled |
| Hot_count_enable_flag | 0 = not enabled;<br>1 = enabled |
| Hot_count_threshold_EPWR | a variable set in File System Configuration File to specify at what hot count level, EPWR is needed. If hot count of all D3 blocks is < hot count threshold, even EPWR enable flag is on, EPWR process is not triggered |
| EPWR_verify_page_budget | a variable set in File System Configuration File to specify how many pages can be read during 1 phase of EPWR |
| EPWR_retries | a variable in File System Configuration File to limit number of retry attempts |
| D3_Block_max_retries | a variable in File System Configuration File to limit the total number of retry attempts on a D3 block over lifetime |

*FIG. 21*

Logical-Page-by-Logical-Page Programming
(2-bit LM Gray Code)

Lower Page Read (LM Gray Code)

Upper Page Read (LM Gray Code)

Accelerated PWR

Selecting a sample of the data programmed in the first group of memory cells, the sample being selected from a subset of data said multiple subsets of data programmed into the first group and the sample is a subset of data estimated to have a highest error rate among said multiple subsets of data programmed into the first group — 910'

3 Data Pages stored on WL

| Physical Block Number | WL Driver | 2k Ecc Page | 2k Ecc Page | 2k Ecc Page | 2k Ecc Page | 2k Ecc Page | 2k Ecc Page | 2k Ecc Page | 2k Ecc Page | WL Driver |
|---|---|---|---|---|---|---|---|---|---|---|
| | | Logical Plane0 | | | | Logical Plane1 | | | | |
| 0 | ▓ | | | | | | | | Lower/ Middl/ Upper | |
| 1 | | Lower/ Middle/ Upper | | | | | | | | ▓ |
| 2 | ▓ | | | | | | | | Lower/ Middl/ Upper | |
| 3 | | Lower/ Middle/ Upper | | | | | | | | ▓ |
| 4 | ▓ | | | | | | | | Lower/ Middl/ Upper | |
| 5 | | Lower/ Middle/ Upper | | | | | | | | ▓ |
| 6 | ▓ | | | | | | | | Lower/ Middl/ Upper | |

| ECC Pages to Check | | | Hot Count Threshold Value |
| --- | --- | --- | --- |
| Lower Page (2k) | Middle Page (2k) | Upper Page (2k) | |
| | √ | √ | 100: Hot Count Range 0-100 |
| | | √ | 150: Hot Count Range 101-150 |
| | | √ | 151: Hot Count Range ≥151 |

*FIG. 31*

CONFIGURABLE ACCELERATED POST-WRITE READ TO MANAGE ERRORS

CROSS REFERENCE TO RELATED APPLICATIONS

This application is related to the following U.S. patent application Ser. No. 12/874,064, filed Sep. 1, 2010; Ser. No. 12/642,728 filed on Dec. 18, 2009; and Ser. No. 12/607,522 filed on Oct. 28, 2009, which applications are incorporated in their entirety by this reference.

BACKGROUND OF THE INVENTION

This application relates to the operation of re-programmable non-volatile memory systems such as semiconductor flash memory, and, more specifically, to handling and efficient managing of errors in memory operations.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Errors in Written Data

In the types of memory systems described herein, as well as in others, including magnetic disc storage systems, the integrity of the data being stored is maintained by use of an error correction technique. Most commonly, an error correction code (ECC) is calculated for each sector or other unit of data that is being stored at one time, and that ECC is stored along with the data. The ECC is most commonly stored together with a unit group of user data from which the ECC has been calculated. The unit group of user data may be a sector or a multi-sector page. When this data is read from the memory, the ECC is used to determine the integrity of the user data being read. Erroneous bits of data within the unit group of data can often be corrected by use of the ECC.

The trend is to reduce the size of the memory systems in order to be able to put more memory cells in the system and to make the system as small as possible to fit in smaller host devices. Memory capacity is increased by a combination of higher integration of circuits and configuring each memory cell to store more bits of data. Both techniques require the memory to operate with increasing tighter margin of error. This in turn places more demand on the ECC to correct errors.

The ECC can be designed to correct a predetermined number of error bits. The more bits it has to correct, the more complex and computationally intensive will the ECC be. For quality assurance, conventional ECC is designed based on the expected worst-case cell error rate at the end of life of the memory device. Thus, they have to correct a maximum number of error bits up to the far tail end of a statistical population of error rate.

As the flash memory ages, its error rate increases rapidly near the end of life of the device. Thus a powerful ECC designed for the worst-case will only be called to apply its full capacity at the end of life of the memory device.

Using ECC to correct a worst-case number of error bits will consume a great amount processing time. The more bits it has to correct, the more computational time is required. The memory performance will be degraded. Additional dedicated hardware may be implemented to perform the ECC in a reasonable amount of time. Such dedicated hardware can take up a considerable amount of space on the controller ASIC chip. Moreover, for most of the life time of the device, the ECC is only marginally utilized, resulting in its large overheads being wasted and realizing no real benefits.

Thus, there is a need to provide a nonvolatile memory of high storage capacity without the need for a resource-intensive ECC over designed for the worse-case.

SUMMARY OF THE INVENTION

A general set of aspects described here presents a method of operating a non-volatile memory circuit. The non-volatile memory circuit is formed of one or more blocks of non-volatile memory cells, the block being a minimum erase unit, where each of the blocks includes one or more groups of memory cells that can be operated in parallel. The method includes, for each of the blocks, maintaining an experience count indicative of the number of erase-program cycles that the corresponding block has experienced. Multiple subsets of data are programmed into a first group of memory cells, each subset of data being provided with an ECC. A sample of the data programmed in the first group of memory cells is selected, the sample being selected from a subset of data said multiple subsets of data programmed into the first group. The selecting of a sample includes selecting a first sample for a first range of experience count values and selecting a second sample for a second range of experience count values. The first and second samples can be selected to differ and the first and second ranges of experience counts are non-overlapping. The selected sample is read and checked for errors. Whenever the errors checked from the selected sample is more than a predetermined number of error bits, the multiple subsets of data are reprogrammed into a second group of memory cells.

According to other aspects, a non-volatile memory system includes a memory circuit formed of an array of one or more blocks of non-volatile memory cells, the block being a minimum erase unit, where each of the blocks includes one or more groups of memory cells. Programming circuitry is connectable to the memory array to program multiple subsets of data into a first group of memory cells, each subset of data being provided with an ECC. The system also includes logic circuitry, where the logic circuitry is configured to perform processes including: for each of the blocks, maintaining an experience count indicative of the number of erase-program cycles that the corresponding block has experienced; and selecting a sample of the data programmed in the first group of memory cells, the sample being selected from a subset of data said multiple subsets of data programmed into the first group. The selecting of a sample includes selecting a first sample for a first range of experience count values and selecting a second sample for a second range of experience count values, where the logic circuitry can select the first and second samples to be different and the first and second ranges of experience counts are non-overlapping. Reading circuitry is connectable to the memory array to read the selected sample. ECC decoding circuitry is connectable to the read circuitry to check errors in the selected sample. The programming circuitry is further connectable to the memory to reprogram said multiple subsets of data into a second group of memory cells whenever the errors checked from the selected sample is more than a predetermined number of error bits.

The foregoing features may be implemented individually or together in various combinations, depending upon the specific application. Additional aspects, advantages and features of the scrubbing system herein are included in the following description of exemplary examples thereof, which description should be taken in conjunction with the accompanying drawings. All patents, patent applications, articles and other publications referenced herein are hereby incorporated herein by this reference in their entirety for all purposes.

BRIEF DESCRIPTION OF THE DRAWINGS

FIG. 9 illustrates schematically a data page containing an ECC field.

FIG. 10A shows a normal distribution of error rate, with the percentage of the population in various ranges of standard deviations cr.

FIG. 10B illustrate the distribution of FIG. 10A in a table format.

FIG. 11 is a table listing the main sources of errors for a flash memory.

FIG. 12 is a table showing estimated total errors for an example memory device at the beginning and end of its life.

FIG. 13 is a table illustrating that a conventional ECC must be designed to correct the worst-case total error $E_{TOT}$.

FIG. 16A illustrates a memory array being partitioned into two portions and the first portion further provided with a cache section and rewrite section, according to a preferred embodiment of the invention.

FIG. 21 is a table illustrating example parameters associated with the enhanced post-write-read error management. The table is preferably maintained in the file system configuration file stored in memory.

FIG. 30 illustrates how samples can be selected for post-write read across different portions of an array.

FIG. 31 is a table specifying hot count ranges and ECC pages to check as an example of settable parameters that can be added to a file system configuration file.

DETAILED DESCRIPTION

Memory System

Figure 1:
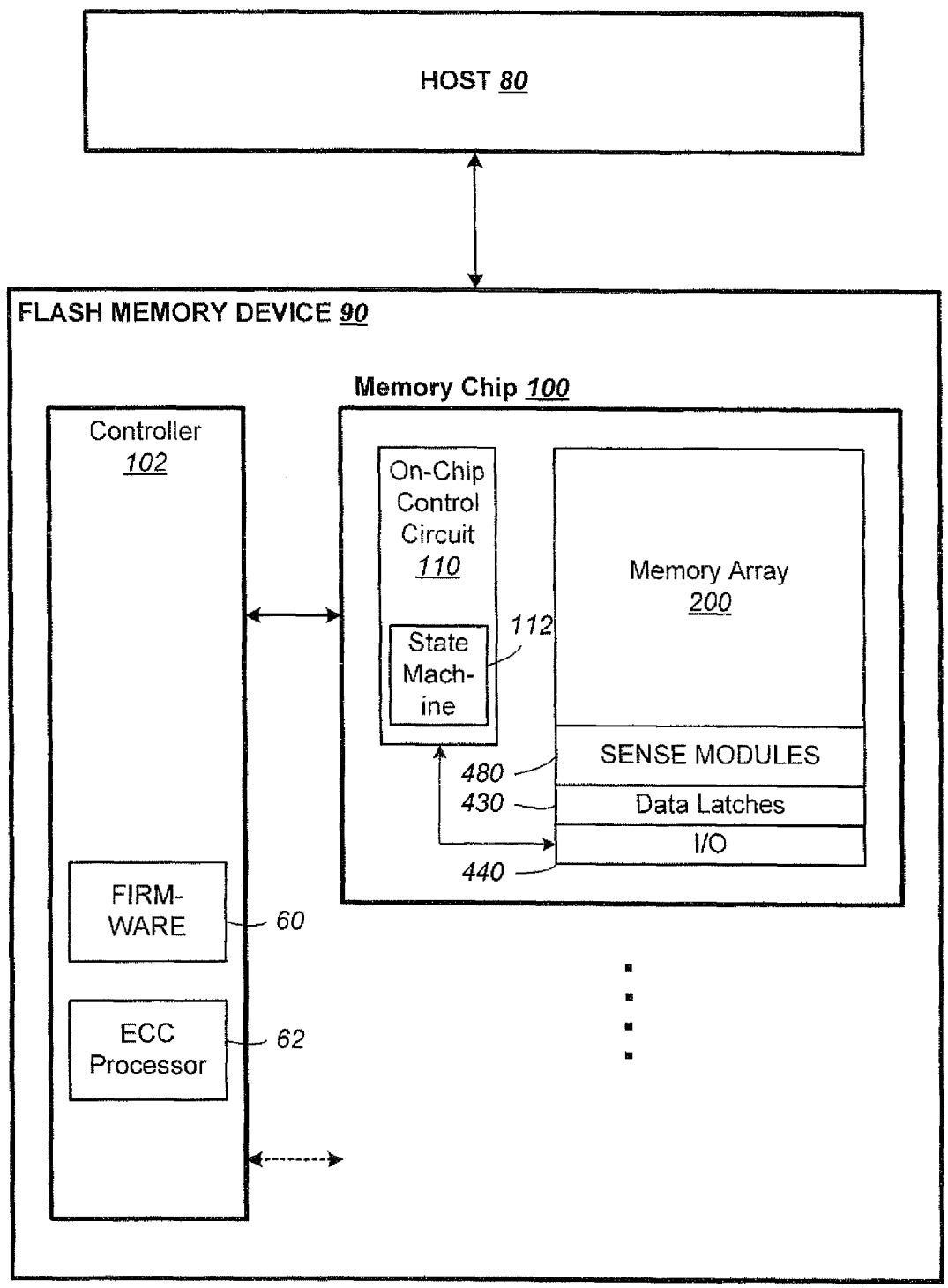
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a controller 102. The memory chip 100 includes a memory array 200 of memory cells with each cell capable of being configured as a multi-level cell ("MLC") for storing multiple bits of data. The memory chip also includes peripheral circuits such as sense modules 480, data latches 430 and I/O circuits 440. An on-chip control circuitry 110 controls low-level memory operations of each chip. The control circuitry 110 is an on-chip controller that cooperates with the peripheral circuits to perform memory operations on the memory array 200. The control circuitry 110 typically includes a state machine 112 to provide chip level control of memory operations.

In many implementations, the host 80 communicates and interacts with the memory chip 100 via the controller 102.

The controller 102 co-operates with the memory chip and controls and manages higher level memory operations. For example, in a host write, the host 10 sends data to be written to the memory array 100 in logical sectors allocated from a file system of the host's operating system. A memory block management system implemented in the controller stages the sectors and maps and stores them to the physical structure of the memory array.

A preferred block management system is disclosed in U.S. application Ser. No. 12/348,891, filed on 1 Jan. 2009, the entire disclosure of which is incorporated herein by reference.

A firmware 60 provides codes to implement the functions of the controller 102. An error correction code ("ECC") processor 62 processes ECC during operations of the memory device. In another embodiment, the controller 102 is implemented within the host.

Physical Memory Structure

Figure 2:
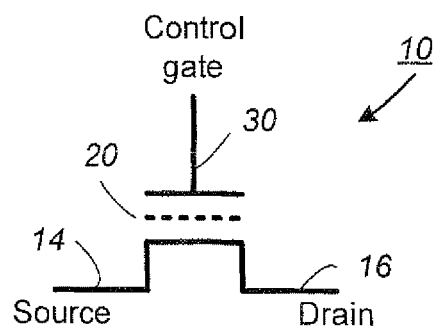
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element. Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Conversely, a threshold voltage is defined as the voltage on the control gate that will just turn on the cell with the given charge. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line or a known capacitor.

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

The memory array 200 is typically organized as a two-dimensional array of memory cells arranged in rows and columns and addressable by word lines and bit lines. The array can be formed according to an NOR type or an NAND type architecture.

Figure 3:
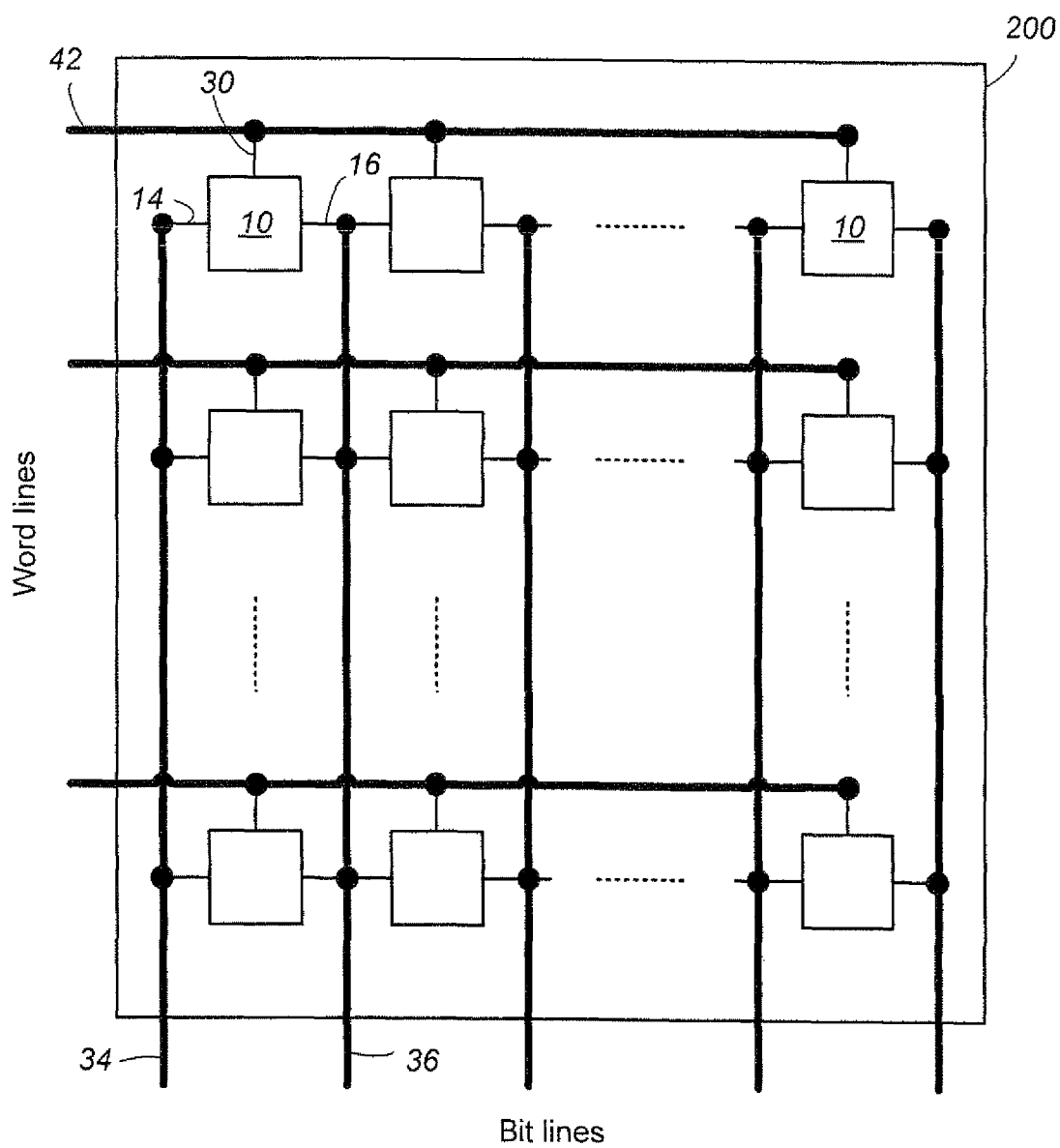
FIG. 3 illustrates an example of an NOR array of memory cells.

FIG. 3 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 4:
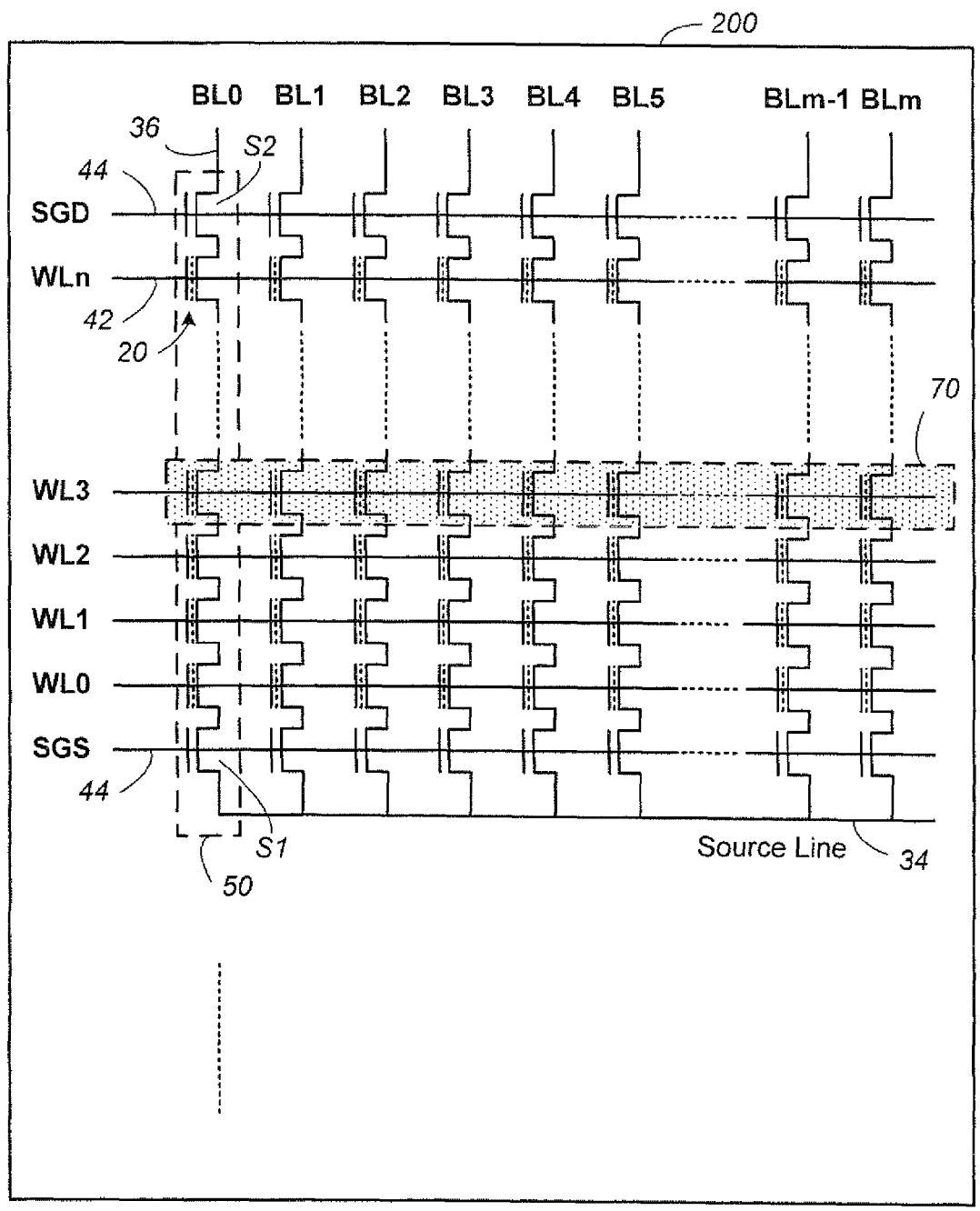
FIG. 4 illustrates a page of memory cells, organized for example in the NAND configuration, being sensed or programmed in parallel.

FIG. 4 illustrates a page of memory cells, organized for example in the NAND configuration, being sensed or programmed in parallel. FIG. 4 essentially shows a bank of NAND strings 50 in the memory array 200. A NAND string 50 comprises of a series of memory transistors (e.g., 4, 8, 16 or higher) daisy-chained by their sources and drains. A pair of select transistors S1, S2 controls the memory transistors chain's connection to the external via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control sate of each of the select transistors S1, S2 (accessed via select lines SGS and SGD respectively) provides control access to the NAND string via its source terminal and drain terminal respectively.

When an addressed memory transistor 10 within an NAND string is read or is verified during programming, its control gate is supplied with an appropriate voltage via a common word line. At the same time, the rest of the non-addressed memory transistors in the NAND string 50 are fully turned on by application of sufficient voltage on their control gates. In this way, a conductive path is effective created from the source of the individual memory transistor to the source terminal of the NAND string and likewise for the drain of the individual memory transistor to the drain terminal of the cell. Memory devices with such NAND string structures are described in U.S. Pat. Nos. 5,570,315, 5,903,495, 6,046,935.

A "page" such as the page 70, is a group of memory cells enabled to be sensed or programmed in parallel. This is accomplished by a corresponding page of sense amplifiers. For example, the page 70 is along a row and is sensed by a sensing voltage applied to the control gates of the cells of the page connected in common to the word line WL3. Along each column, each cell such as cell 10 is accessible by a sense amplifier via a bit line 36. The page referred to above is a physical page memory cells or sense amplifiers. Depending on context, in the case where each cell is storing.

Sensing Circuits and Techniques

Figure 5A:
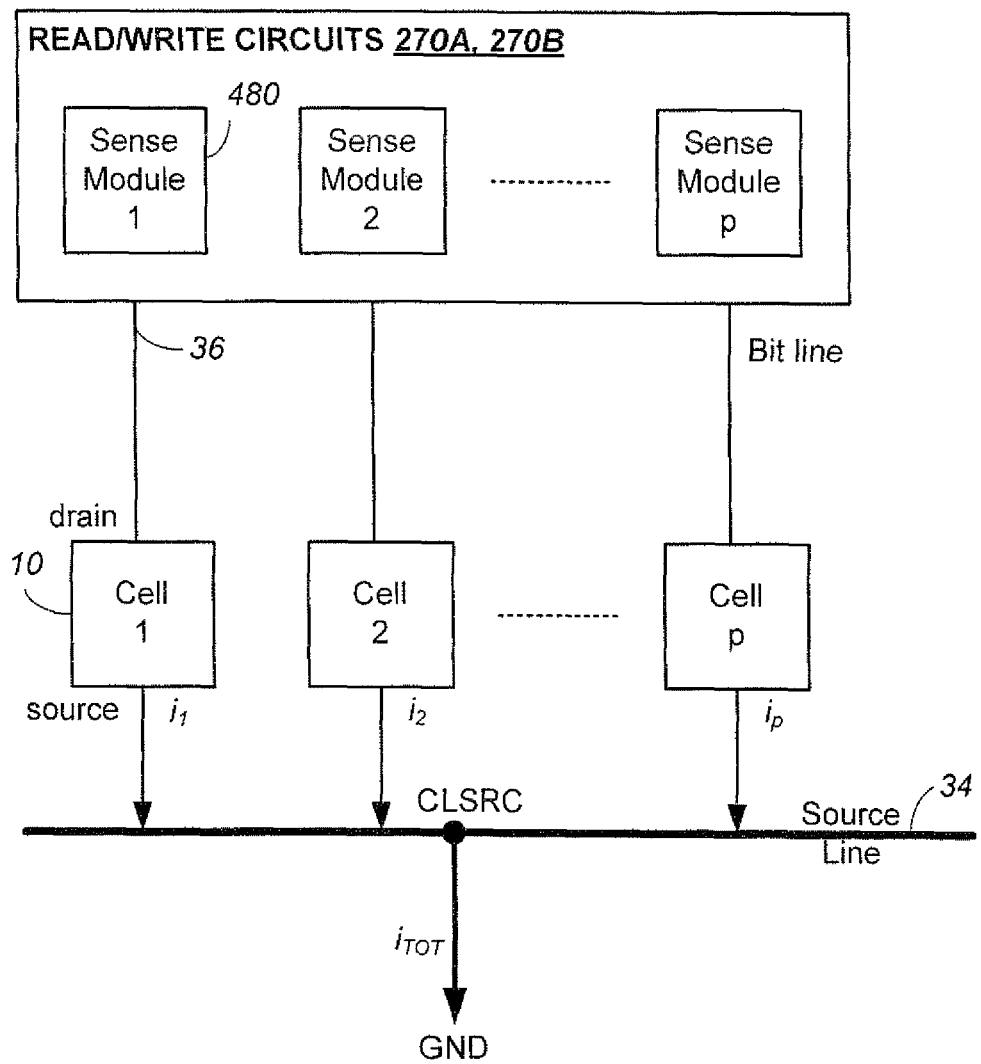
FIG. 5A illustrates in more detail the sense modules shown in FIG. 1 to contain a bank of p sense modules across an array of memory cells.

FIG. 5A illustrates in more detail the sense modules shown in FIG. 1 to contain a bank of p sense modules across an array of memory cells. The entire bank of p sense modules 480 operating in parallel allows a group (or physical page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells.

In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A physical page of sensing circuits is coupled to either the even bit lines or to the odd bit lines at any one time.

In currently produced chips, the physical page may be 64 k or larger. In the preferred embodiment, the group is a run of the entire row of cells. This is the so-called "all bit-line" architecture in which the page is constituted from a row of contiguous memory cells coupled respectively to contiguous bit lines.

Figure 5B:
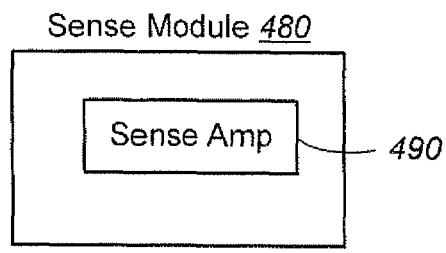
FIG. 5B illustrates a sense module including a sense amplifier.

FIG. 5B illustrates a sense module including a sense amplifier. The sense amplifier 490 detects the conduction current of a cell is above or below a reference level. The sensed results are latches in a corresponding set of latches 430 (see FIG. 1).

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 6:
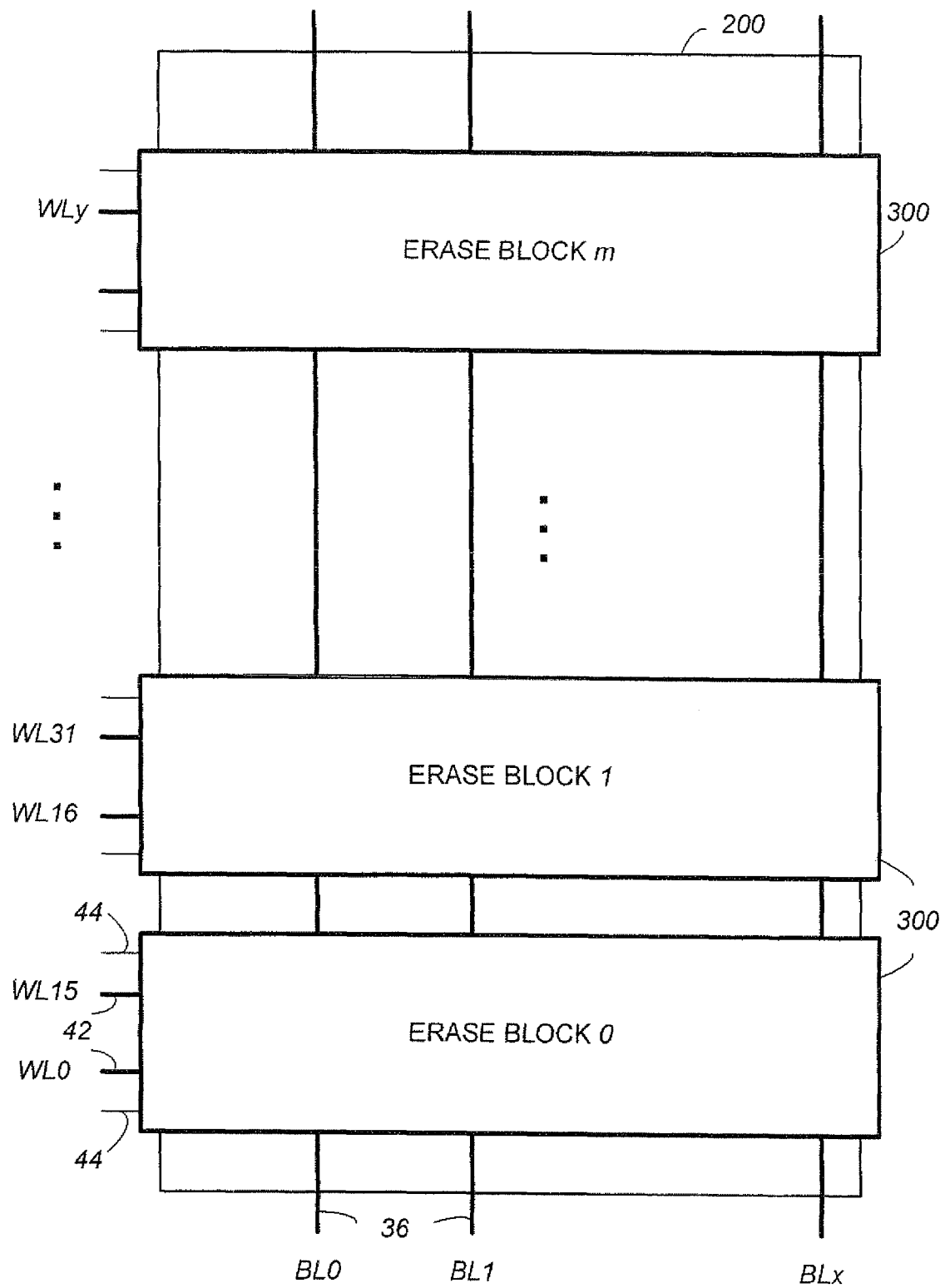
FIG. 6 illustrates schematically an example of a memory array organized in erasable blocks.

FIG. 6 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 6, individual memory cells in the memory array 200 are accessible by word lines 42 such as WL0-WLy and bit lines 36 such as BL0-BLx. The memory is organized into erase blocks, such as erase blocks 0, 1, . . . m.

Referring also to FIGS. 5A and 5B, if the NAND string 50 contains 16 memory cells, then the first bank of NAND strings in the array will be accessible by select lines 44 and word lines 42 such as WL0 to WL15. The erase block 0 is organized to have all the memory cells of the first bank of NAND strings erased together. In another memory architecture, more than one bank of NAND strings may be erased together.

Examples of Binary (SLC) And Multi-State (MLC) Memory Partitioning

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits.

Figure 7:
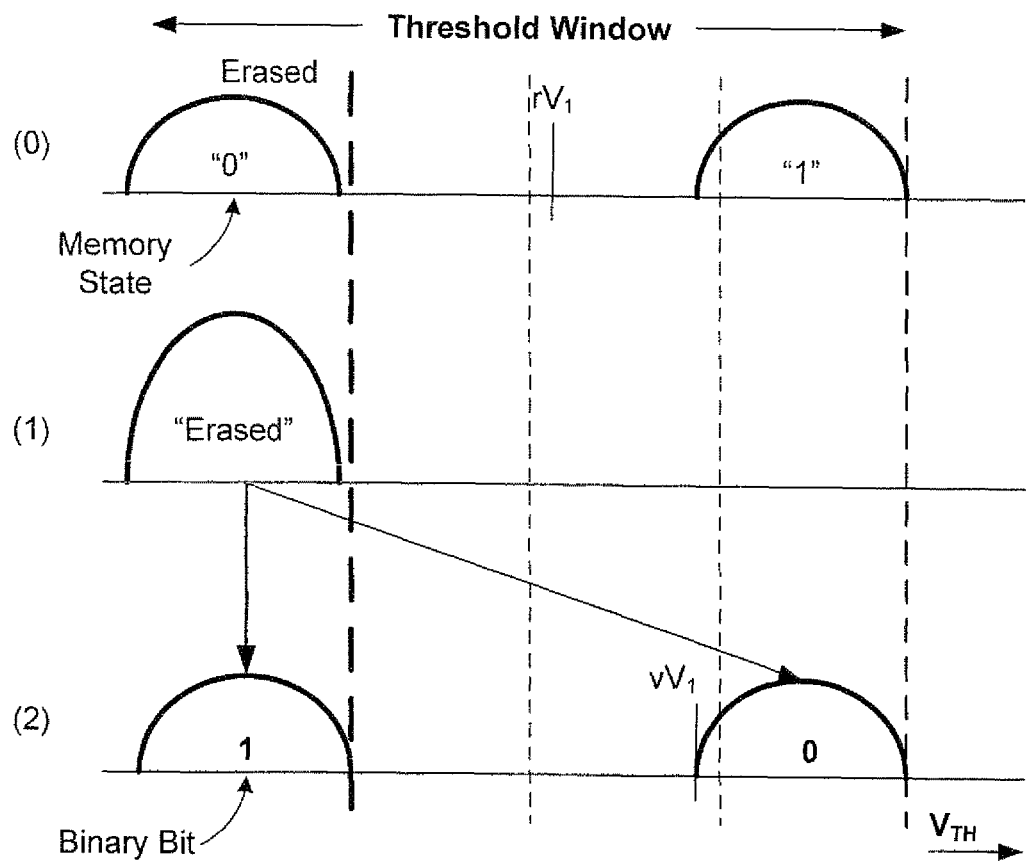
FIG. 7 illustrates a binary memory having a population of cells with each cell being in one of two possible states.

FIG. 7 illustrates a binary memory having a population of cells with each cell being in one of two possible states. Each memory cell has its threshold window partitioned by a single demarcation level into two distinct zones. As shown in FIG. 7(0), during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. FIG. 7(1) illustrates the memory initially has all its cells in the "erased" state. FIG. 7(2) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 8:
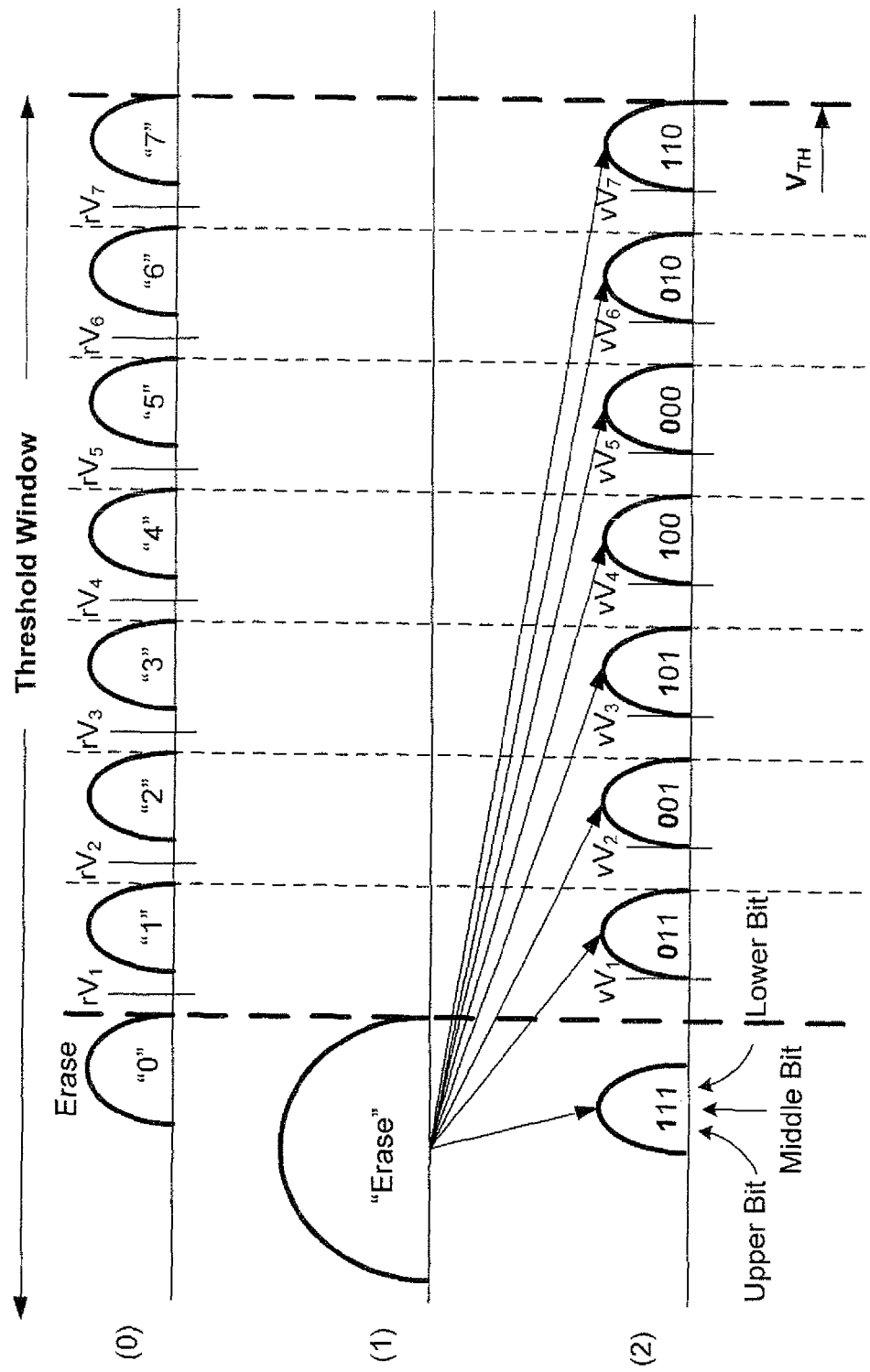
FIG. 8 illustrates a multi-state memory having a population of cells with each cell being in one of eight possible states.

FIG. 8 illustrates a multi-state memory having a population of cells with each cell being in one of eight possible states. Each memory cell has its threshold window partitioned by at least seven demarcation levels into eight distinct zones. As shown in FIG. 8(0), during read, read demarcation levels $rV_1$ to $rV_7$ are used to determine to which zone the threshold level of the cell lies. The cell is in an "erased" state if its threshold is located in the lowest zone and is in one of multiple "programmed" states if its threshold is located in the upper zones. FIG. 8(1) illustrates the memory initially has all its cells in the "erased" state. FIG. 8(2) illustrates some of cells being programmed to the "programmed" state. A 3-bit code having lower, middle and upper bits can be used to represent each of the eight memory states. For example, the "0", "1", "2", "3". "4", "5", "6" and "7" states are respectively represented by "111", "011", "001", "101', "100", "000", "010" and '110". Typically programming is performed by application of one or more programming voltage pulses. After each pulse, the cell is sensed to verify if the threshold has moved beyond a reference which is one of verify demarcation levels $vV_1$ to $vV_7$. A memory with such memory cell partitioning is referred to as "multi-state" memory or Multi-level Cell ("MLC") memory.

Similarly, a memory storing 4-bit code will have lower, first middle, second middle and upper bits, representing each of the sixteen states. The threshold window will be demarcated by at least 15 demarcation levels into sixteen distinct zones.

As the memory's finite threshold window is partitioned into more regions, the resolution for programming and reading will necessarily become finer. Thus, a multi-state or MLC memory necessarily operates with a narrower margin of error compared to that of a memory with less partitioned zones. In other words, the error rate increases with the number of bits stored in each cell. In general, error rate increases with the number of partitioned zones in the threshold window.

Correction by Error Correction Code ("ECC")

Flash memory is prone to errors. To ensure error-free data, an error correction code ("ECC") is implemented to correct errors.

FIG. 9 illustrates schematically a data page containing an ECC field. As described in connection with FIG. 4 and FIG. 6A, a physical page of memory cells is programmed and read in parallel by virtue of a corresponding page of sense modules operating in parallel. When each memory cell stores multiple bits of data, there will be multiple data pages associated with each physical page. The data page 70' comprises a user portion 72' and a system portion 74'. The user portion 72' is for storage of user data. The system portion 74' is generally used by the memory system for storage of system data. Included in the system data is an ECC. The ECC is computed for the data page. Typically, the ECC is computed by the ECC processor 62 in the controller 102 (see FIG. 1.)

As data is received from a host, a page of data is staged in the controller 102 and its ECC 76' is computed by the ECC processor 62. The data page incorporating the ECC is then written to the memory array 200. Typically, when the data page is read, the data page is latched in the data latches 430 and shifted out of the I/O circuits 440 to the controller 102. At the controller 102, the data page's existing ECC is compared to a second version of the ECC computed on the read data. The ECC typically includes an error detection code ("EDC") for rapid detection of any error in the data page. If the EDC indicates the existence of any error in the read data page, the ECC is invoked to correct erroneous bits in the read data page.

The ECC can be designed to correct any number of error bits. The more bits it has to correct, the more complex and computationally intensive will the ECC be. For quality assurance, conventional ECC is designed based on the expected worst case cell error rate ("CER") at the end of life ("EOL") of the memory device. Thus, they have to correct a maximum number of error bits up to the far tail end of a statistical error population.

FIG. 10A shows a normal distribution of error rate with the percentage of the population in various ranges of standard deviations σ. For example, only 2.1% of the population lies within the range from 2σ to 3σ. Only 0.1% of the population lies within the range from 3σ to 4σ.

FIG. 10B illustrate the distribution of FIG. 10A in a table format. It can be seen that only E-09 or one in one billion of the population lies beyond 6σ. The last column in the table shows the estimated error rates for an example memory device in the worst case. For example, 5% of the population will have 1, error bit, 0.135% of the population will have 4 error bits and 1 in 1 billion of the population will have 42 error bits.

Consider a sample of 125 memory cards. Each card has a capacity of 16 GB with data pages of 2 KB each. This amounts to a population of one billion pages of 2 KB each. To ensure not a single page of the sample of 125 memory cards will have an error at the end of life of the card, an ECC capable of correcting up to 42 bits will be needed.

Errors During the Life Time of Memory

As described above, an ECC is typically designed to correct for any errors expected during the useful life of the memory. The errors come from a number of sources.

FIG. 11 is a table listing the main sources of errors for a flash memory. FIG. 11(A) shows a first source of error from post write $E_{PW}(N_{CYC})$ which is bit errors that are present after the page is written. In flash memory, "programming" refers to the process of increasing the threshold of a cell from an erased state. The term will be used interchangeable with "writing". The error rate increases with $N_{CYC}$ the number of program-erase cycling. After data has been written to a cell, in spite of passing the verify operation, the data could still be erroneous for two causes.

The first cause of post write error is due to over-programming not detected by the verify operation. Over-programming that can happen when a number of the memory cells are to be programmed at the same time. This is because the characteristics of each memory cell are different due to minor variations in the structure and operation of the semi-conductor devices which comprise the memory cells; therefore, variations in the programming speed of different cells will typically occur. This results in memory cells that become programmed faster than others and the possibility that some memory cells will be programmed to a different state than intended. Faster programming of multiple memory cells can result in over-shooting desired threshold voltage level ranges, producing errors in the data being stored.

Typically, when data is being programmed, the program-verify process for the device will check if the programmed threshold voltage of the memory cell is above than a reference level demarcating the current state from the adjacent less programmed state. However, the program-verify does not know how much above the reference level is the programmed threshold voltage. Thus, devices typically do not guarantee an upper limit on the threshold voltage. Some devices do check to see if a soft programming process (described below) raised the threshold voltage too high; however, these devices do not check to see if a regular programming process raised the threshold voltage too high. Thus, over programming which raises the threshold voltage beyond the range for the desired state can occur without being noticed. Over programming can cause the memory cell to overshoot to the next programmed state and thus storing incorrect data. This error will be detected during subsequent read operations, in which the programmed threshold of a cell is typically checked relative to both a lower and an upper limit demarcating a threshold range for a given memory state. More information about over programming can be found in U.S. Pat. Nos. 5,321,699; 5,386,422; 5,469,444; 5,602,789; 6,134,140; 6,914,823; and 6,917,542.

The second cause of post write error is in the apparent shifts in the stored charge levels due to field coupling between storage elements. The degree of this coupling is necessarily increasing as the sizes of memory cell arrays are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. In particular, when sensed the memory cell will appear to have a higher threshold level (or more programmed) than when it is less perturbed. This is also known as the Yupin effect, and is described in U.S. Pat. No. 5,867,429, which patent is incorporated herein in their entirety by this reference. This patent describes either physically isolating the two groups of storage elements from each other, or taking into account the effect of the charge on the second group of storage elements when reading that of the first group.

FIG. 11(B) shows a second source of error $E_{DR}(T, N_{CYC})$ which is bit errors due to data retention at EOL. The error rate increases with temperature T and $N_{CYC}$ the number of program-erase cycling. The data error is due to the history of the device. It typically is related to a data retention problem, which depends on the memory device exposure to the environment, e.g., temperature. Over time, the actual stored charge levels may leak away slowly, causing the programmed thresholds to decrease.

As the number of states stored in each memory cell increases, the tolerance of any shifts in the programmed charge level on the storage elements decreases. Since the ranges of charge designated for each storage stat necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with the that cell, such as those in the same column or row, and those sharing a line or node.

FIG. 11(C) shows a third source of error $E_{RD}(N_R, N_{CYC})$ which are bit errors due to read disturb. The error rate increases with the number of reads and $N_{CYC}$ the number of program-erase cycling.

An important consideration for flash memory is that it has an endurance problem as it ages with use. When a cell is repeatedly programmed and erased, charges are shuttled in and out of the floating gate 20 (see FIG. 2) by tunneling across a dielectric. Each time some charges may become trapped in the dielectric and will modify the threshold of the cell. The number of program-erase cycles a cell has experienced is measured by a cycle count $N_{CYC}$ (also known as "hot count"). Though repeated cycling, the value of $N_{CYC}$ increases for a given erase block, causing the threshold window for the cells in the block to narrow progressively. Thus, the effect program-erase cycling will significantly impact all the sources of error listed in FIG. 11.

FIG. 12 is a table showing estimated total errors for an example memory device at the beginning and end of its life. FIG. 12(A) shows the total errors from the three sources listed in FIG. 11(A) to FIG. 11(C) to be $E_{TOT}(N_{CYC}, N_R) = E_{PW}(N_{CYC}) + E_{DR}(T, N_{CYC}) + E_{RD}(N_R, N_{CYC})$.

FIG. 12(B) shows an estimated $E_{TOT}$ when the memory is relatively fresh (low $N_{CYC}$) but has been baked at 85° C. for 5 years and has been read $10^6$ times. The estimates for the various component errors are: $E_{PW}(1) \sim 3$, $E_{DR}(85°$ C., $1) \sim 2$, and $E_{RD}(1M, 1) \sim 0$. These yield a total estimated error $E_{TOT}(1, 1M) = 3+2+0 = 5$ bits.

FIG. 12(C) shows an estimated $E_{TOT}$ when the memory is near the end of life of the device ("EOL"). It is characterized by a high program-erase cycling ($N_{CYC} = 10K$) with other parameters similar to that of FIG. 12(B). The estimates for the various component errors are: $E_{PW}(10K) \sim 10$, $E_{DR}(85°$ C., $10K) \sim 10$, and $E_{RD}(1M, 10K) \sim 1$. These yield a total estimated error $E_{TOT}(10K, 1M) = 10+10+1 = 21$ bits.

Of the three sources of error described in FIG. 11 and FIG. 12, generally the error due to read disturb $E_{RD}$ is not as significant as error due to write $E_{PW}$ and error due to data retention $E_{DR}$. Data retention errors can be alleviated by periodically refreshing the threshold levels of the cells in a "read scrub" operation.

To correct for the various errors that may arise in the memory, especially the error arising after write, an EEC (described earlier in connection FIG. 9) is employed. However, using ECC to correct errors will consume processing time and, the more bits it has to correct, the more computational time is required. The memory performance will be degraded by employing a strong ECC able to correct a large number of error bit. Additional dedicated hardware may be implemented to perform the ECC in a reasonable amount of time. Such dedicated hardware can take up a considerable amount of space on the controller ASIC chip.

FIG. 13 is a table illustrating that a conventional ECC must be designed to correct the worst-case total error $E_{TOT}$. That will be a device at the end of life with high program-erase cycle count and data retention specification. For the example given in FIG. 12(C), the ECC must be capable of correcting at least 21 error bits.

Adaptively Rewrite Data from a Higher Density Memory Portion to a Lower Error Rate Memory Portion to Control Error Rate According to a general aspect of the invention, a flash memory having an array of memory cells is configured with a first portion and a second portion. The second portion stores data at higher density but operates with a smaller margin of errors compared to the first portion. Data is written to the second portion for efficient storage. Afterwards, the data is read back to check for excessive error bits. If the error bits exceeded a predetermined amount, the data is rewritten to the less error-prone first portion. This places a limit on the maximum number of error bits arising from writing data to the memory. In a statistical distribution of error rates, the limit represents a limit on the number standard derivations of the distribution so that the far tail-end of the distribution (with higher error rates) can be ignored. This allows a smaller and more efficient error correction code ("ECC") to be designed for correcting a smaller number of errors bits, thereby improving the performance and reducing the cost of the memory.

Figure 14A:
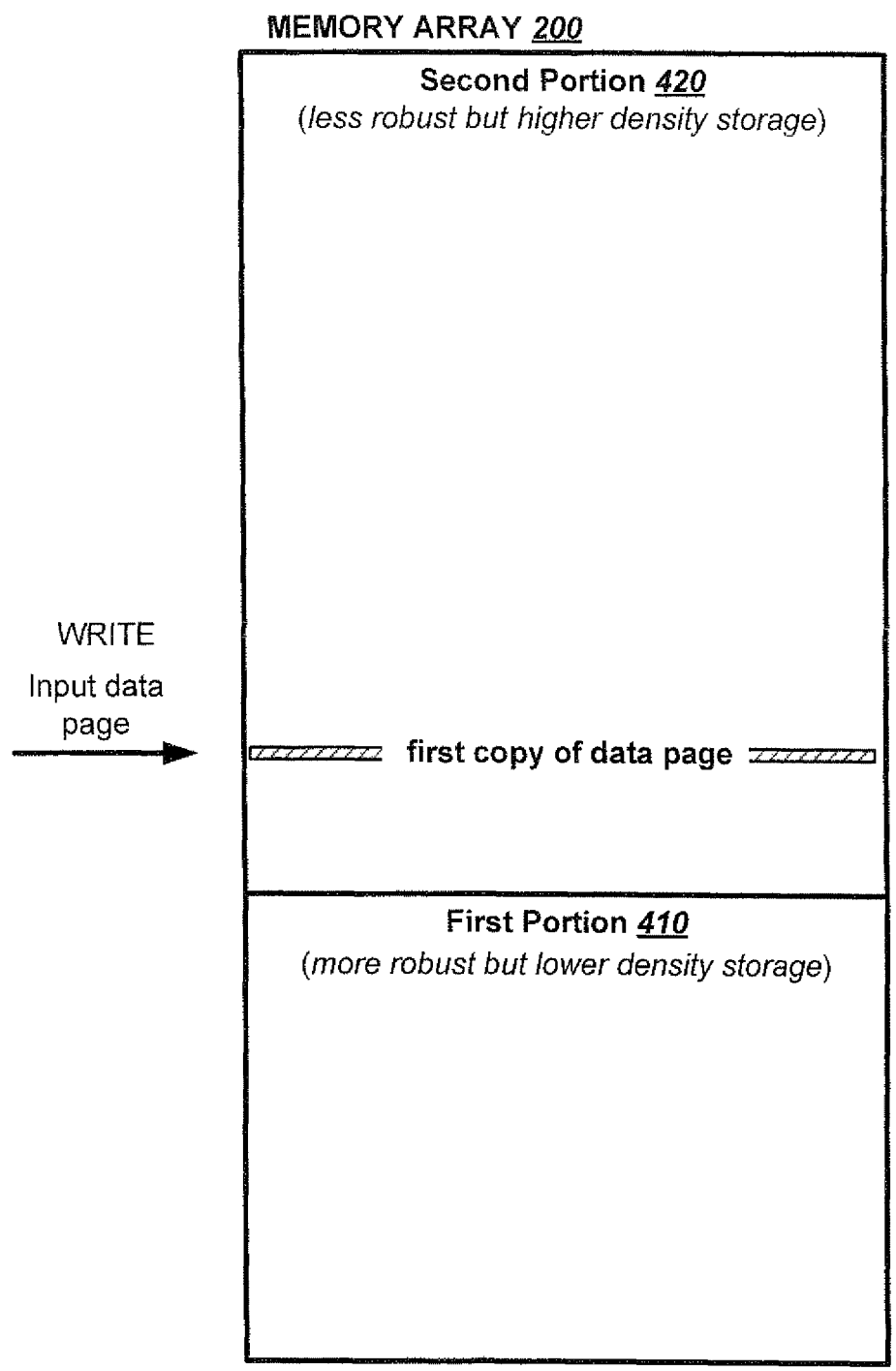
FIG. 14A illustrates a memory array being partitioned into two portions according to a preferred embodiment of the invention.

FIG. 14A illustrates a memory array being partitioned into two portions according to a preferred embodiment of the invention. The array of memory cells 200 is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. For example, a memory cell in the first portion is configured to store 1 bit of data as compared to 3 bits of data in the second portion. In view of the discussion earlier, the first portion will operate with a much wider margin of error compared to that of the second portion. Thus, memory operations in the first portion will have less error than that in the second portion.

U.S. Pat. No. 6,456,528, entitled "Selective Operation of a Multi-state Non-volatile Memory System in a Binary Mode", discloses a flash non-volatile memory having memory cells normally operating in more than two states but with selected memory cells operating in only two-states in order to provide an increased margin during two-state operation. This allows faster programming and a longer operational life of the memory cells being operated in two states when it is more desirable to have these advantages than the increased density of data storage that multi-state operation provides. The entire disclosure of U.S. Pat. No. 6,456,528 is incorporated herein by reference.

When a page of incoming data is to be written to the memory array 200, it is preferably stored in the high density second portion for the sake of efficiency and high capacity. Thus a first copy of the data page is written to the second portion.

Later, the first copy of the data page is read back in a "post write read" to determine if there are any errors. This is accomplished either by comparison with the original copy which may be cached or by checking the EDC portion of the ECC.

Determination is made whether the number of error bits in the read copy exceeded a predetermined amount. If the number of error bits does not exceed the predetermined amount, the first copy is regarded stored in the second portion is deemed valid. Subsequent read of the data page will be from the first copy in second portion and any errors will be corrected by ECC at the controller.

As explained earlier in connection with FIG. 11, the verify process during programming only checks for under-programming and not over-programming. Thus, error may still exist after the data page has been program-verified. It will take a read operation relative to all the demarcation levels (see FIG. 7 and FIG. 8) to detect any error in the data page. Furthermore, the Yupin effect of subsequent programming of neighboring cells could perturb the data page in question and shift the apparent sensed results. Thus, the read back should at least be after the programming of all neighboring cells that could have significant Yupin effect on the current data page. In another embodiment, the read back is after all the cells in the block containing the data page in question are done programming.

"Post write read" is also disclosed in U.S. Pat. Nos. 6,914,823, 6,917,542 and 7,009,889, their entire disclosures are incorporated herein by reference.

Figure 14B:
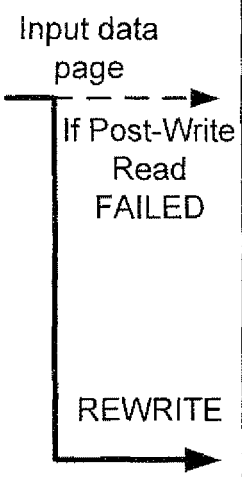
FIG. 14B illustrates a rewrite of a second copy of the data page into the first portion of the memory array of FIG. 14A.

FIG. 14B illustrates a rewrite of a second copy of the data page into the first portion of the memory array of FIG. 14A. After the post-write read detects the number of error bits in the data page has exceeded the predetermined amount, a second copy of the data page is rewritten to the first portion. The second copy is of the original data which may be cached or in another embodiment, by retrieving the first copy and correcting the error bits with the ECC.

After the second copy has been written to the first portion, it will replace the first copy in the second portion as the valid copy. The first copy will become obsolete and a directory in a block management system embodied in the firmware of the controller (see FIG. 1) will be updated to direct subsequent access to the second copy.

In one preferred embodiment, the first portion has each memory cell storing one bit of data and the second portion has each memory cell storing more than one bit of data.

Figure 15:
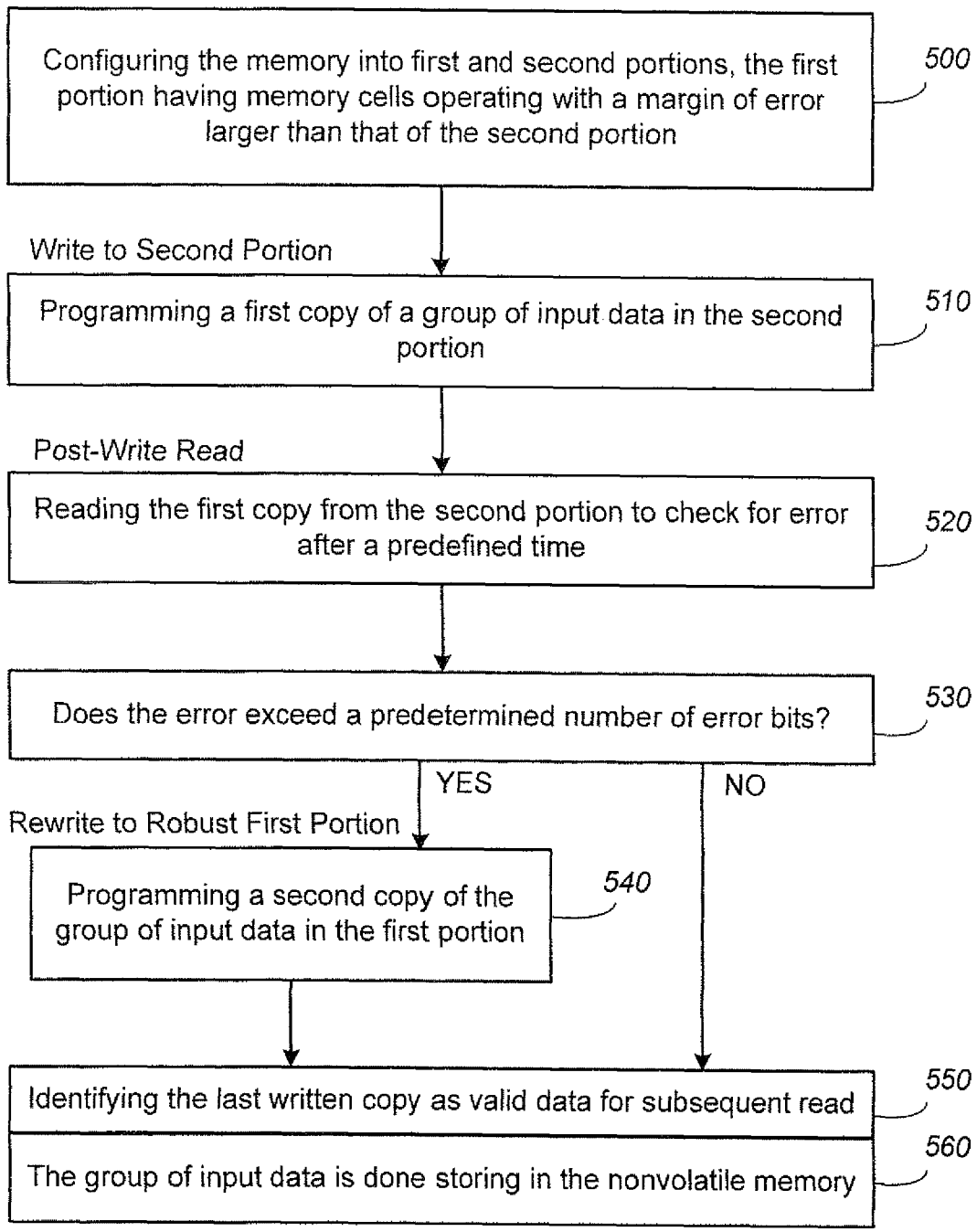
FIG. 15 is a flow diagram illustrating the process of post-write read and adaptive rewrite according to the embodiment described in FIG. 14A and FIG. 14B.

FIG. 15 is a flow diagram illustrating the process of post-write read and adaptive rewrite according to the embodiment described in FIG. 14A and FIG. 14B.

STEP 500: Configuring the memory into first and second portions, the first portion having memory cells operating with a margin of error larger than that of the second portion.

STEP 510: Programming a first copy of a group of input data in the second portion.

STEP 520: Reading the first copy from the second portion to check for error after a predefined time.

STEP 530: Does the error exceed a predetermined number of error bits? If so, proceed to STEP 540. Otherwise proceed to STEP 550.

STEP 540: Programming a second copy of the group of input data in the first portion.

STEP 550: Identifying the last written copy as valid data for subsequent read.

STEP 560: The group of input data is done storing in the nonvolatile memory.

As described above, an ECC is typically designed to correct for any errors expected during the useful life of the memory. The errors come from a number of sources.

In an alternative embodiment, the first portion serves as a cache for incoming data, so a cache copy of the input data is programmed into the cache. Then a first copy of data is programmed into the second portion.

If the post-write read has not detected an excessive amount of error in the first copy, the first copy will be deemed valid and subsequent read will be directed to access the first copy.

On the other hand, if the post-write read has detected an excessive amount of error in the first copy, the cached copy in the first portion will replace the first copy in the second portion as valid data. The first copy will become obsolete and a directory in a block management system embodied in the firmware of the controller (see FIG. 1) will be update to direct subsequent access to the cached copy.

U.S. Pat. No. 5,930,167, entitled "Multi-state Non-volatile Flash Memory Capable of Being its Own Two State Write Cache", discloses a flash memory array having two portions. A first portion is configured to store one bit per cell and a second portion is configured to store more than one bit per cell. The first portion acts as a low-density write cache. Incoming data is initially cached in the first portion. At a later time, in the background, the cached data is transferred to the second portion with higher storage density. The entire disclosure of U.S. Pat. No. 5,930,167 is incorporated herein by reference.

In the preferred embodiment, the first portion is further provided with a first section and a second section. The incoming data is cached in the first section of the first portion and a first copy of the data is written to the second portion. Afterwards, the first copy in the second portion is read back to check for excessive error bits. If the error bits exceeded a predetermined amount, a second copy of the in coming data is written to the second section of the first portion.

FIG. 16A illustrates a memory array being partitioned into two portions and the first portion further provided with a cache section and rewrite section, according to a preferred embodiment of the invention. As in FIG. 14A, the array of memory cells 200 is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. The first portion therefore operates with a wider margin of error than that of the second portion.

The first portion 410 is further provided with a first section 411 for caching incoming data and a second section 412 for storing rewrites from the second portion.

When a page of incoming data is to be written to the memory array 200, a cached copy is cached in the first section 411 of the first portion 410. A first copy is preferably stored in the high density second portion for the sake of efficiency and high capacity. Thus a first copy of the data page is written to the second portion.

According to another preferred embodiment, the memory array is provided with a set of data latches on an integrated circuit chip, the checking of the error bits in the first copy is accomplished by loading the first copy and the cached copy into the set of data latches and making a comparison at the set of data latches.

By not making the comparison at the controller, the data does not have to be toggled out to the controller, much time can be saved. FIG. 1 shows the data latches 430, which is on-chip, for the data comparison to take place.

Figure 16B:
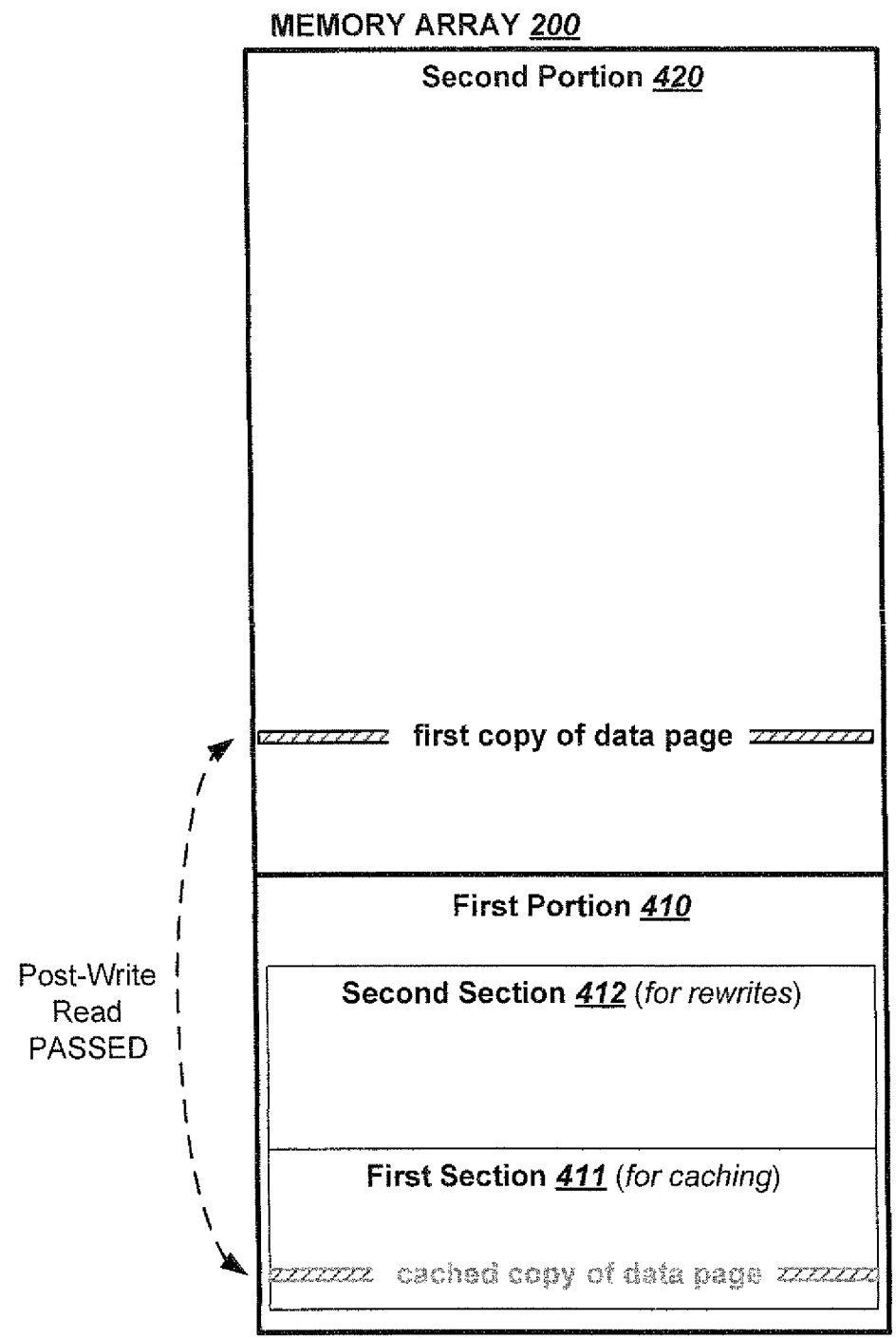
FIG. 16B illustrates a page compare technique according a preferred embodiment of the post-write read.

FIG. 16B illustrates a page compare technique according a preferred embodiment of the post-write read. The first copy of the data page in the second portion is read back in a "post write read" to determine if there are any errors. This is accomplished by comparison with the cached copy.

If the number of error bits does not exceed the predetermined amount, the first copy stored in the second portion is deemed to be valid. The cached copy will become obsolete and a directory in a block management system embodied in the firmware of the controller (see FIG. 1) will be updated to direct subsequent access to the first copy. Subsequent read of the data page will be from the first copy in the second portion and any errors will be corrected by ECC at the controller.

Figure 16C:
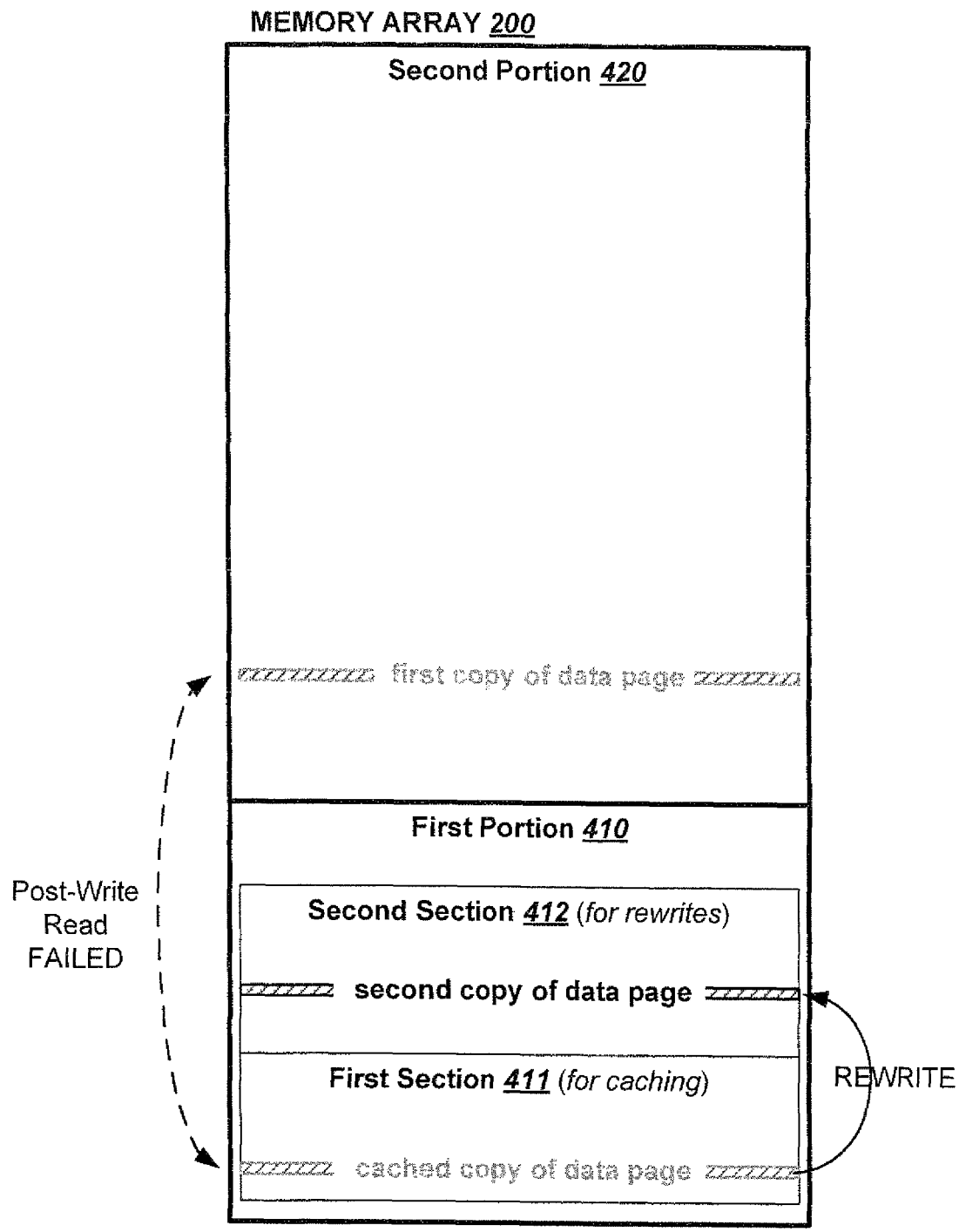
FIG. 16C illustrates a rewrite to the first portion after a post-write read has determined an excessive amount of error in the data page in the second portion.

FIG. 16C illustrates a rewrite to the first portion after a post-write read has determined an excessive amount of error in the data page in the second portion. After the post-write read detects the number of error bits in the data page of the first copy has exceeded the predetermined amount, a second copy of the data page is rewritten to the second section 412 of the first portion 410. The second copy is taken from the cached copy.

After the second copy has been written to the second section 412 of the first portion, it will replace the first copy in the second portion. The first copy and the cached copy will become obsolete and a directory in a block management system embodied in the firmware of the controller (see FIG. 1) will be updated to direct subsequent access to the second copy.

Figure 17:
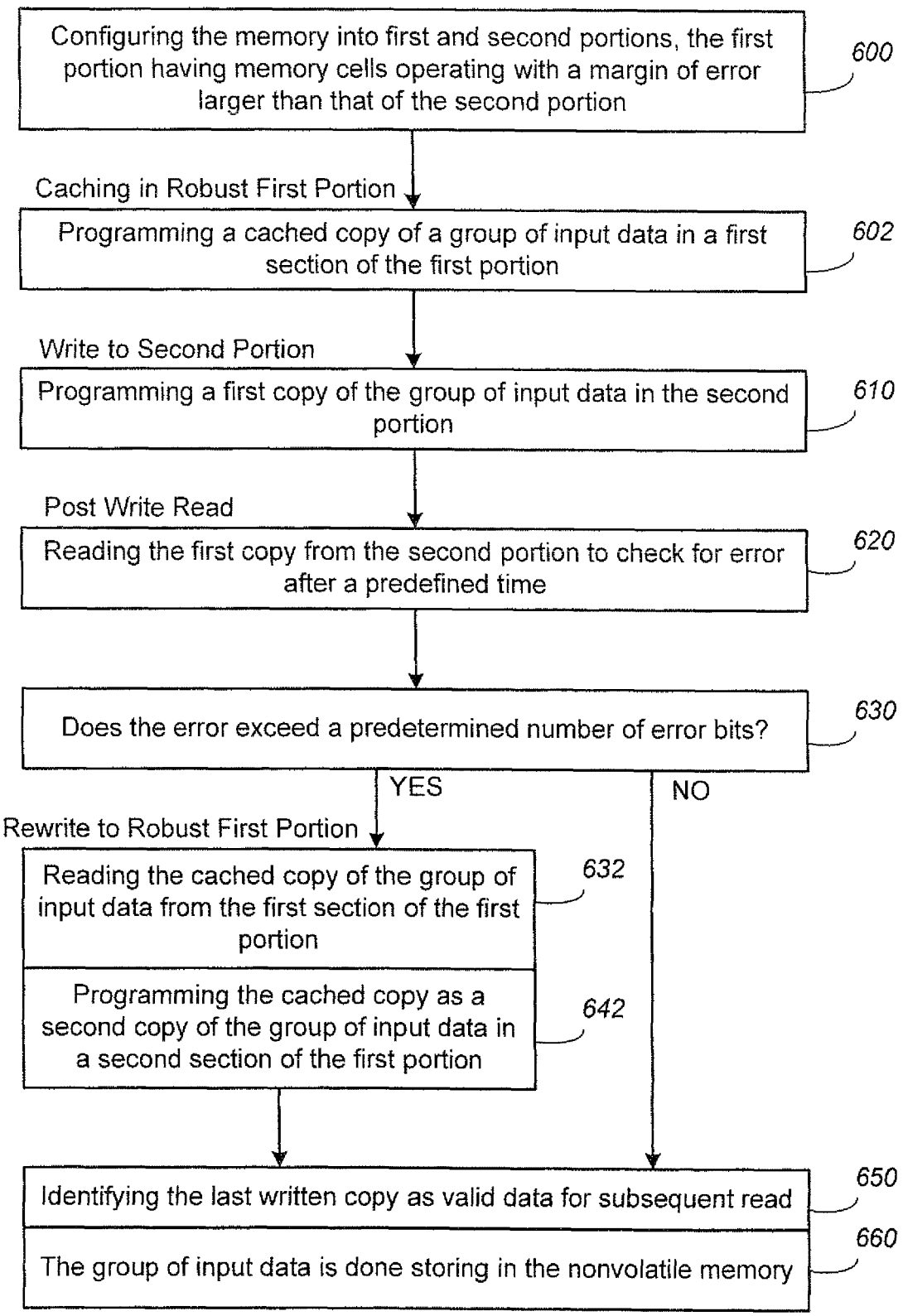
FIG. 17 is a flow diagram illustrating the process of post-write read and adaptive rewrite according to the embodiment described in FIG. 16A to FIG. 16C.

FIG. 17 is a flow diagram illustrating the process of post-write read and adaptive rewrite according to the embodiment described in FIG. 16A to FIG. 16C.

STEP 600: Configuring the memory into first and second portions, the first portion having memory cells operating with a margin of error larger than that of the second portion.

STEP 602: Programming a cached copy of a group of input data in a first section of the first portion.

STEP 610: Programming a first copy of the group of input data in the second portion.

STEP 620: Reading the first copy from the second portion to check for error after a predefined time.

STEP 630: Does the error exceed a predetermined number of error bits? If so, proceed to STEP 632. Otherwise proceed to STEP 650.

STEP 632: Reading the cached copy of the group of input data from the first section of the first portion.

STEP 642: Programming the cached copy as a second copy of the group of input data in a second section of the first portion.

STEP 650: Identifying the last written copy as valid data for subsequent read.

STEP 660: The group of input data is done storing in the nonvolatile memory.

As described above, an ECC is typically designed to correct for any errors expected during the useful life of the memory. The errors come from a number of sources.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Enhanced Post-Write-Read Error Management

In another aspect of the invention, an enhanced post-write read error management is implemented. The post-write read is not enabled at the beginning of life of a memory device. The error rate of the memory device at the beginning of life is very low and there is no need to operate the post-write read. This avoids wasting time to do post-write read. As the memory device ages through use, the enhanced post-write read and error management of the invention is enabled at a predetermined age of the device.

In a preferred embodiment, the age of the memory device is determined by a hot count maintained with each erase block of memory cells. The hot count tracks the endurance or the number of times the erase block has been cycled through erase and program operations. Whenever a hot count of an erase block passes a predetermined hot count threshold, the enhanced post-write-read error management will commence and operate until the end of life of the memory device.

Figure 18:
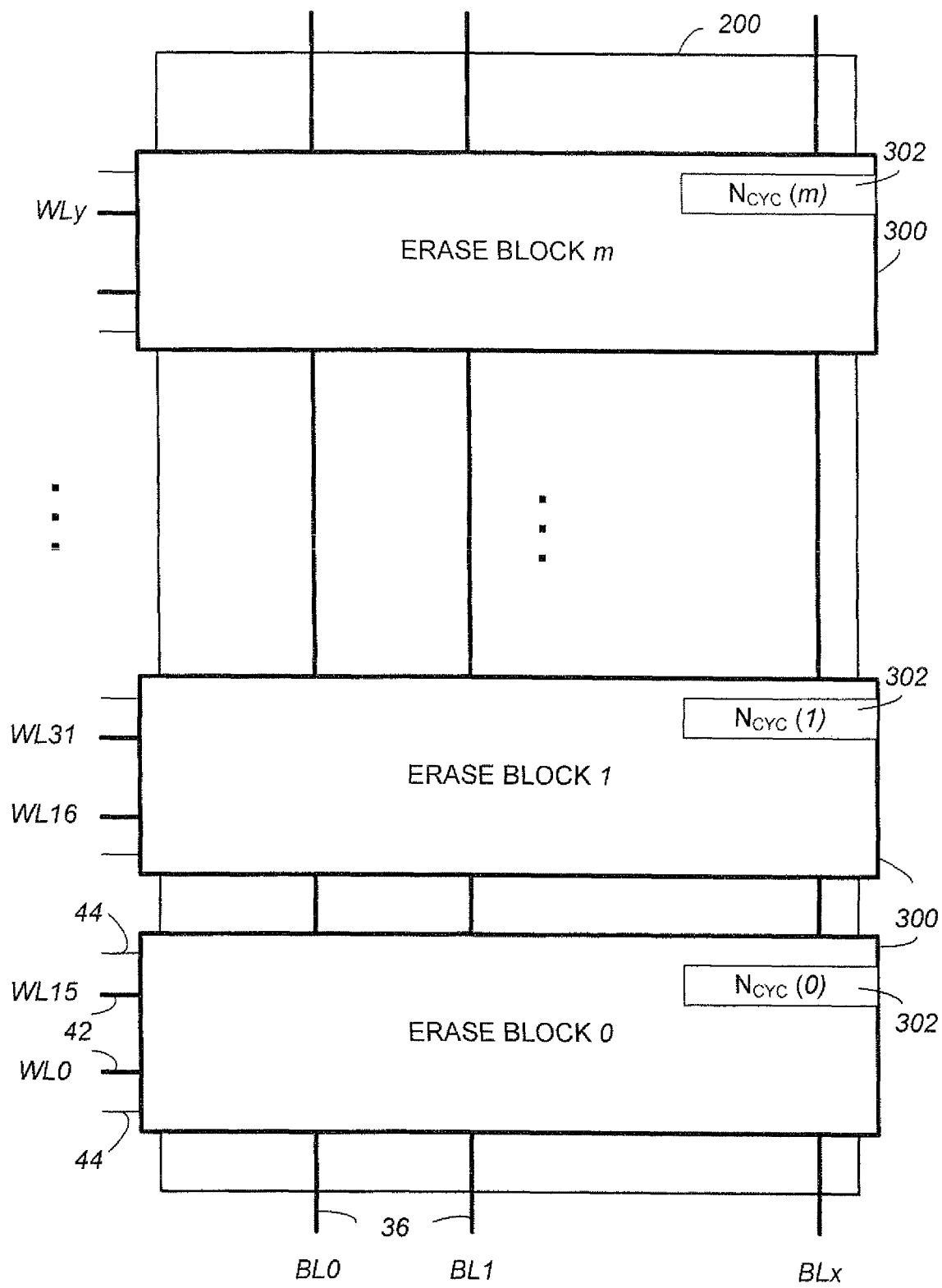
FIG. 18 illustrates a memory organized into erase blocks.

FIG. 1S illustrates a memory organized into erase blocks. As described in connection with FIG. 6 earlier, each erase block is a group of memory cells that are erased together. Also described earlier is when a cell is repeatedly programmed and erased, charges are shuttled in and out of the floating gate 20 (see FIG. 2) by tunneling across a dielectric. Each time some charges may become trapped in the dielectric and will modify the threshold of the cell. The number of program-erase cycles a cell has experienced is measured by a cycle count $N_{CYC}$ (also known as "hot count"), Though repeated cycling, the value of $N_{CYC}$ increases for a given erase block, and the threshold window for the cells in the block narrows progressively. FIG. 18 illustrates a preferred embodiment in which a hot count $N_{CYC}(m)$ 302 is maintained in each erase block (m). Since the programmable unit is a page, the hot count for each block can be store in the system data area of the data page 70' illustrated in FIG. 9. Alternatively, the hot counts may be stored in a master list in the memory. Every time a block is erased, its hot count is incremented by one.

Figure 19:
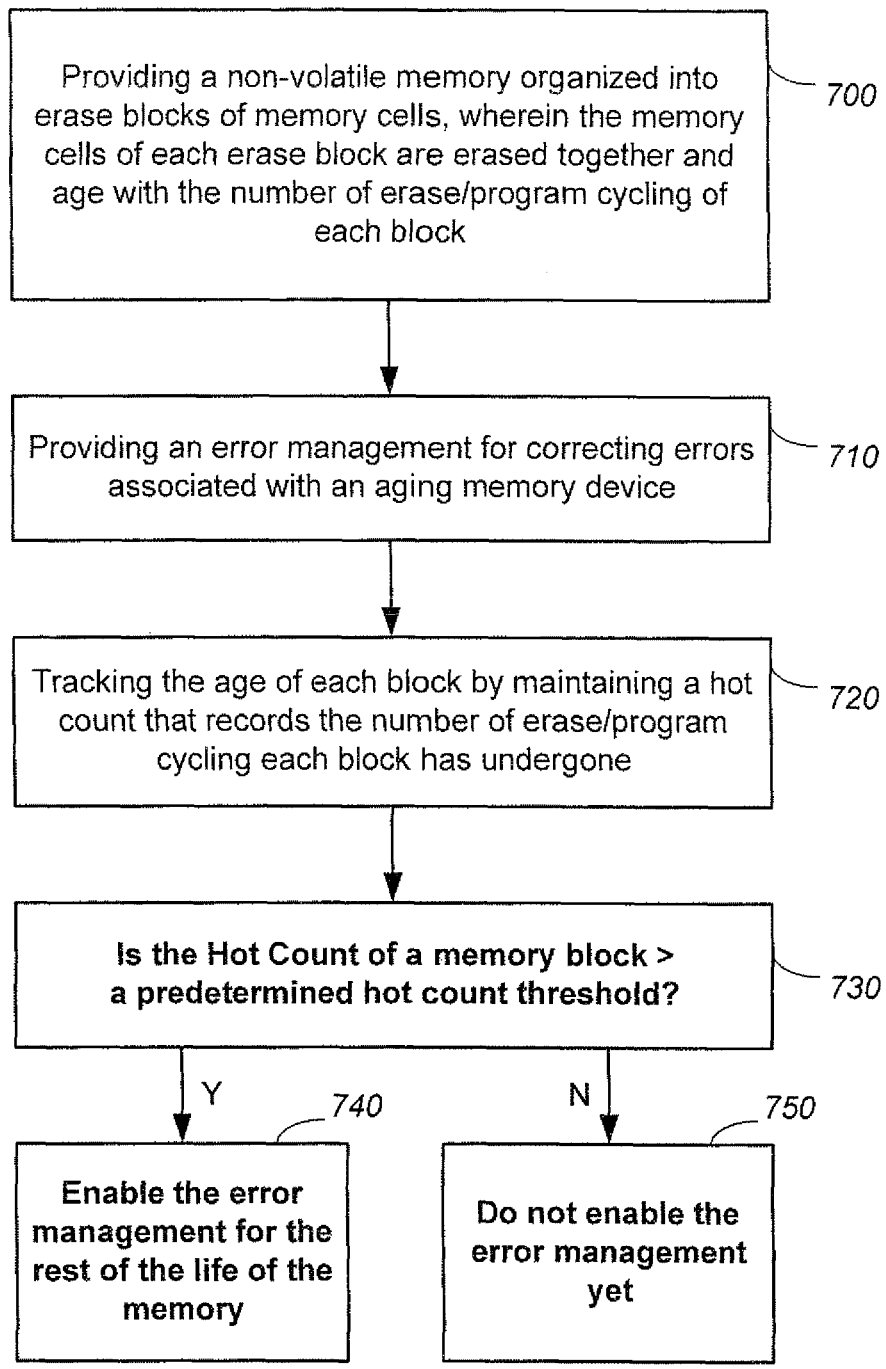
FIG. 19 is a flow diagram illustrating the error management being enabled when the memory device has aged to a predetermined degree as determined by a hot count.

FIG. 19 is a flow diagram illustrating the error management being enabled when the memory device has aged to a predetermined degree as determined by a hot count.

STEP 700: Providing a non-volatile memory organized into erase blocks of memory cells, wherein the memory cells of each erase block are erased together and age with the number of erase/program cycling of each block.

STEP 710: Providing an error management for correcting errors associated with an aging memory device. In the preferred embodiment, the error management is the post-write-read error management described earlier.

STEP 720: Tracking the age of each block by maintaining a hot count that records the number of erase/program cycling each block has undergone.

STEP 730: Is the Hot Count of a memory block>a predetermined hot count threshold? In the preferred embodiment, the predetermined hot count threshold is given by a parameter Hot_count_threshold_EPWR in a file system configuration file stored in the memory (see FIG. 21.) If greater than, go to STEP 740, otherwise go to STEP 750.

STEP 740: Enable the error management for the rest of the life of the memory.

STEP 750: Do not enable the error management yet.

As described above, an ECC is typically designed to correct for any errors expected during the useful life of the memory. The errors come from a number of sources.

In a preferred embodiment of yet another aspect of the invention, the high density storage portion of the memory (D3) has each memory storing 3 bits of data. The less error-prone, low density storage portion of the memory (D1) has each memory cell storing 1 bit of data. Input data is first staged in D1 and subsequently folded into D3. When the enhanced post-write-read error management is enabled, a current, filled block in D3 is read back; and if the error rate exceeds a predetermined threshold, the current D3 block is rejected and a retry takes place with data being refolded into a new D3 block. The new D3 block is again read back and checked for excessive error rate. If the new D3 block passes, then it has good data and the original data in D1 is made obsolete. If the new D3 block again shows excessive error rate, the new D3 block is again discarded. If the excessive error rate persists after a predetermined number of retries, no further retry is attempted and the D1 to D3 folding operation is abandoned with the original data kept at D1. At this point the memory device is deemed too old for further programming operations and is made read-only to preserve the integrity of the existing data stored in the memory device.

Figure 20A:
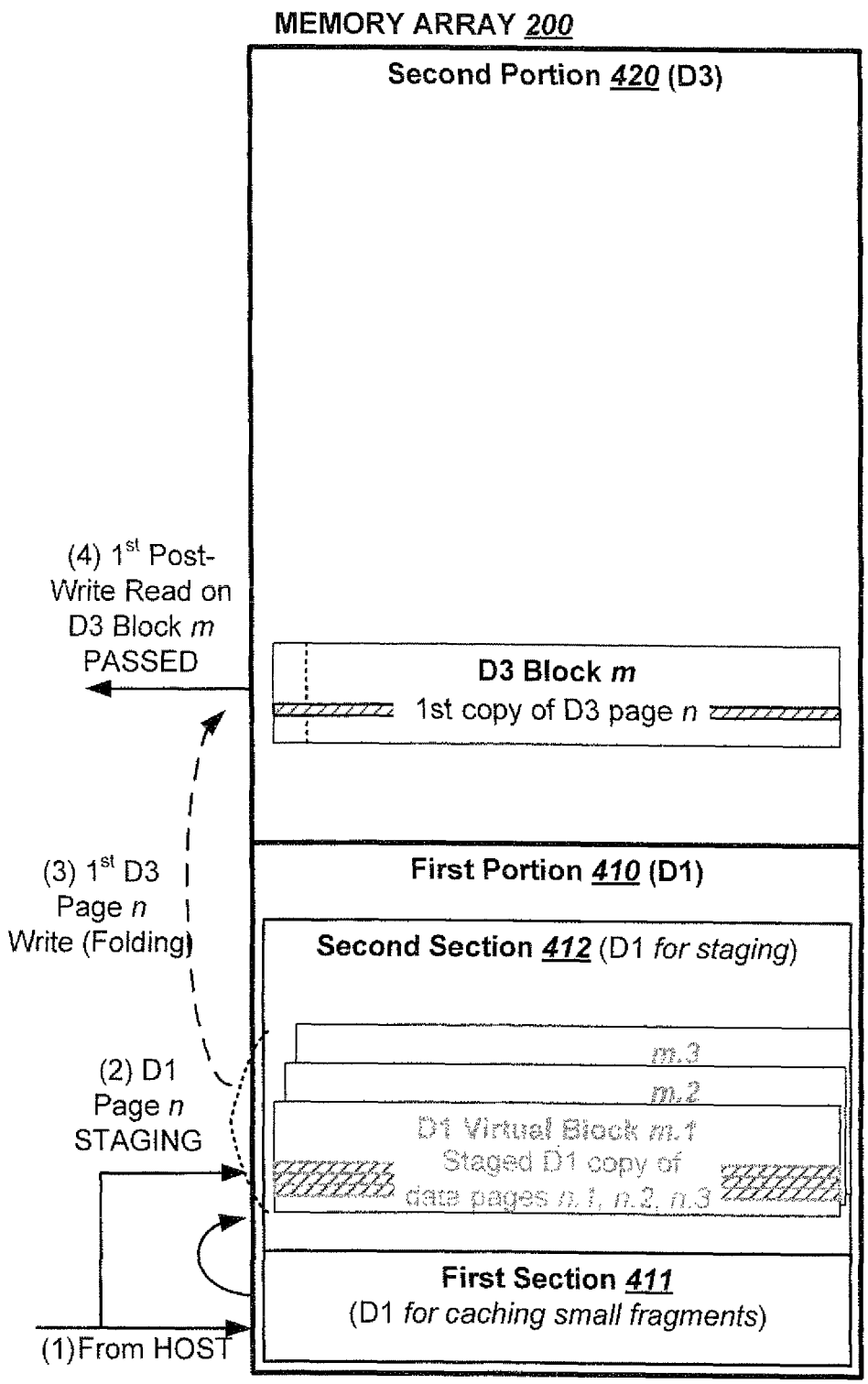
FIG. 20A illustrates a memory array being partitioned into two portions according to a preferred embodiment of the invention.
Figure 20B:
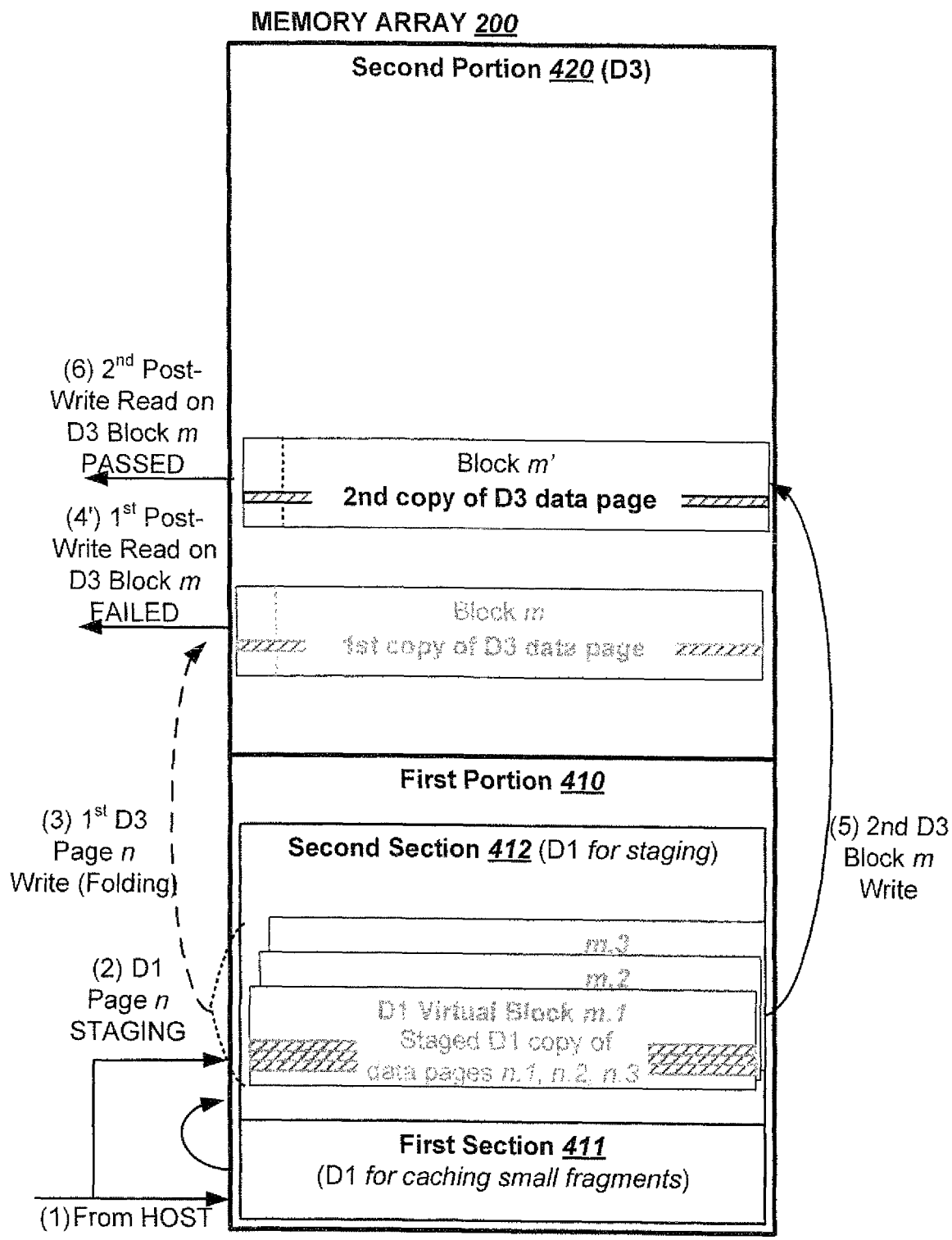
FIG. 20B illustrates another example in which the D3 block of FIG. 20A fails a post-write-read test.
Figure 20C:
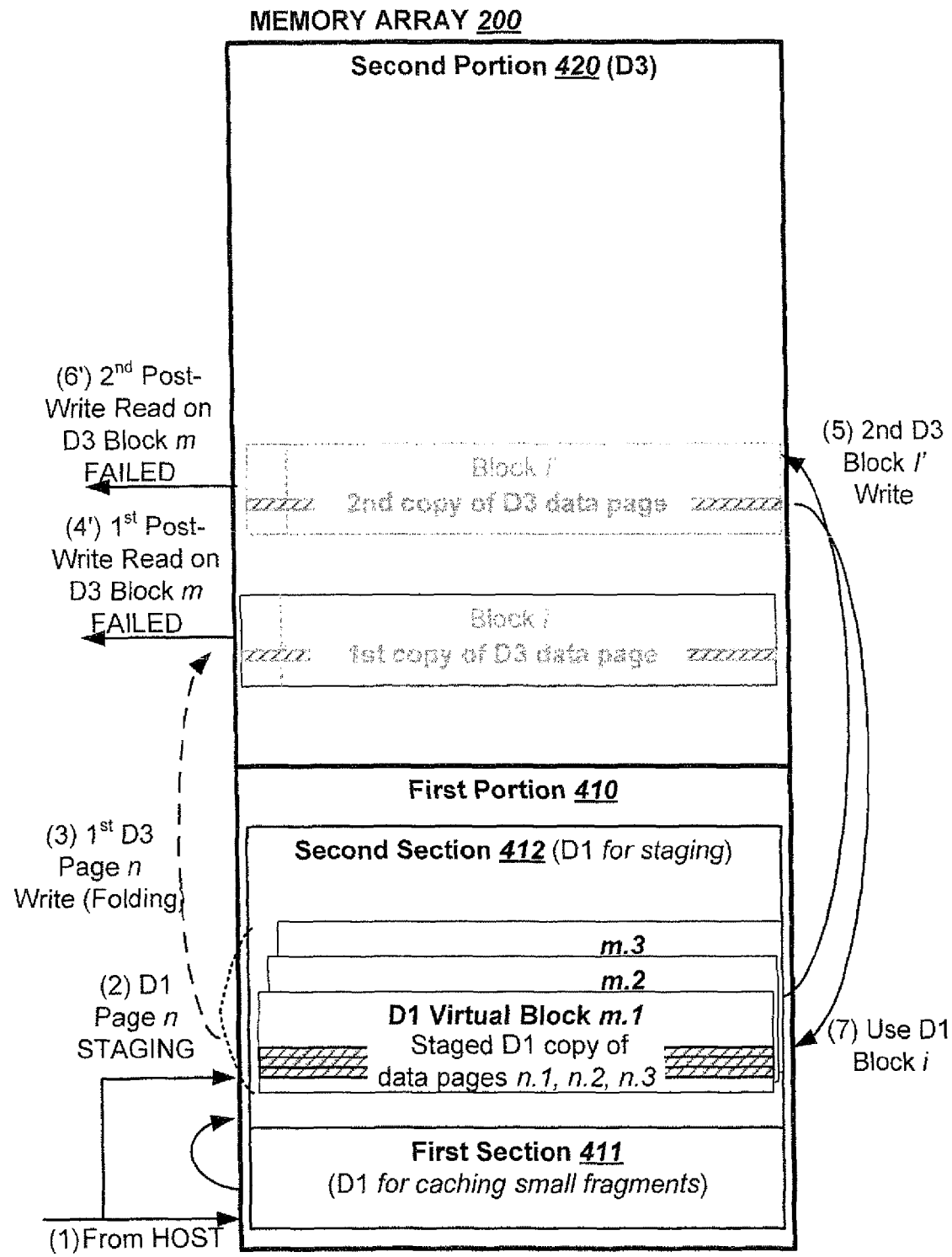
FIG. 20C illustrates another example in which the new D3 block of FIG. 20B fails the post-write read test again.

FIGS. 20A-20C illustrate various examples of implementing the post-write-read error management in a memory configured with D1 and D3 portions. A memory configured with D1 and D3 portion is also disclosed in United States Application entitled "MAINTAINING UPDATES OF MULTI-LEVEL NON-VOLATILE MEMORY IN BINARY NON-VOLATILE MEMORY" by Gorobets et al, filed on the same day as the present application; the entire disclosure of which is incorporated herein by reference.

FIG. 20A illustrates a memory array being partitioned into two portions according to a preferred embodiment of the invention. The array of memory cells 200 (see FIG. 1) is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. For example, a memory cell in the first portion is configured to store 1 bit of data as compared to 3 bits of data in the second portion. The first portion storing 1 bit of data per cell will also be referred as D1 and the second portion storing 3 bit of data per cell as D3. In view of the discussion earlier, the first portion will operate with a much wider margin of error compared to that of the second portion. Thus, memory operations in the first portion will have less error than that in the second portion.

In one embodiment, the first portion 410 or D1 is further partitioned into a first section 411 and a second section 412.

In Step (1), during a host write, input data is either first cached in the first section 411 or written directly to the second section 412. If the input data is fragmented, it is first cached in the first section. If the input data is a substantial run of sequential data, it is written page by page directly into the second section 412.

In Step (2), in any case, the input data eventually ends up in the second section 412 where the written pages are staged into virtual D1 blocks, such as blocks m.1, m.2 and m.3. In a scheme where each block contains data from a well defined group of logical addresses, a virtual block may not correspond to a physical block but still have the group of logical addresses distributed over several physical D1 blocks.

In Step (3), as data is being written page by page into D1, when a triplet of binary pages is in D1, it can be copied to a single 3-bit page in D3 in what is also referred as folding from D1 to D3.

By implementing the enhanced post-write-read error management ("EPWR"), at some point which the lifetime of the memory the post-write-read error management will commence.

In Step (4), a D3 block m is complete after the entire pages of the virtual D1 blocks m.1, m.2 and m.3 have been folded into it. Thereafter it can be processed by the EPWR where the data in the D3 block is read back and checked for ECC errors. If the number of ECC errors is less than a predetermined threshold as such given by a parameter E_pw_heck set in the File system configuration file, then the data in the D3 block is deemed valid. The corresponding D1 pages can then be safely replaced and retired.

FIG. 20B illustrates another example in which the D3 block of FIG. 20A fails a post-write-read test. Step (1) to Step (3) are the same as that of FIG. 20A.

In Step (4'), when the data in the D3 block is read back, the number of ECC error is found to be greater than E_pw_check. This means the data in D3 is marginal at best and cannot be used.

In Step (5), in the event of the existing D3 block failing the post-write-read test, the EPWR prescribes a retry by folding the data into a new D3 block.

In Step (6), the data in the new D3 block is subjected to another post-write-read test. If it passes the test, the data in the new D3 block is deemed valid. The corresponding D1 pages can then be safely replaced and retired.

FIG. 20C illustrates another example in which the new D3 block of FIG. 20B fails the post-write read test again. Step (1) to Step (5) are the same as that of FIG. 20B.

In Step (6'), when the data in the new D3 block is read back, the number of ECC errors is found to be greater than E_pw_check. This means the data in the retried D3 block is still not good and cannot be used.

The EPWR process can prescribe further retry to another D3 block. The number of retries is set by a parameter, EPWR_retries in the file system configuration file. For example, if EPWR_retries is 1, then the process will end after the new block fails the test.

In that event, in Step (7), the new D3 block can not be used and the file system will direct access to corresponding data that reside in D1 instead.

FIG. 21 is a table illustrating example parameters associated with the enhanced post-write-read error management. The table is preferably maintained in the file system configuration file stored in memory.

E_pw_check—a variable set in File System Configuration File to specify at what # of ECC bits level, a D3 block is consider high risk and restart of D1 to D3 folding to a new D3 block is required.

ECC_threshold_SLC—a variable is needed in File System Configuration File for maintaining SLC threshold to compare against in order to make a decision to continue with EPWR or not.

EPWR_enable_flag—controlled in File System Configuration File. 0=not set (Default); 1=set when EPWR is enabled.

Hot_count_enable_—flag—0=not enabled; 1=enabled.

Hot_count_threshold_EPWR—a variable set in File System Configuration File to specify at what hot count level, EPWR is needed. If hot count of all D3 blocks is <hot count threshold, even EPWR enable flag is on, EPWR process is not triggered.

EPWR_verify_page_budget—a variable set in File System Configuration File to specify how many pages can be read during 1 phase of EPWR.

EPWR_retries—a variable in File System Configuration File to limit number of retry attempts.

D3_Block_max_retries—a variable in File System. Configuration File to limit the total number of retry attempts on a D3 block over lifetime.

Figure 22A:
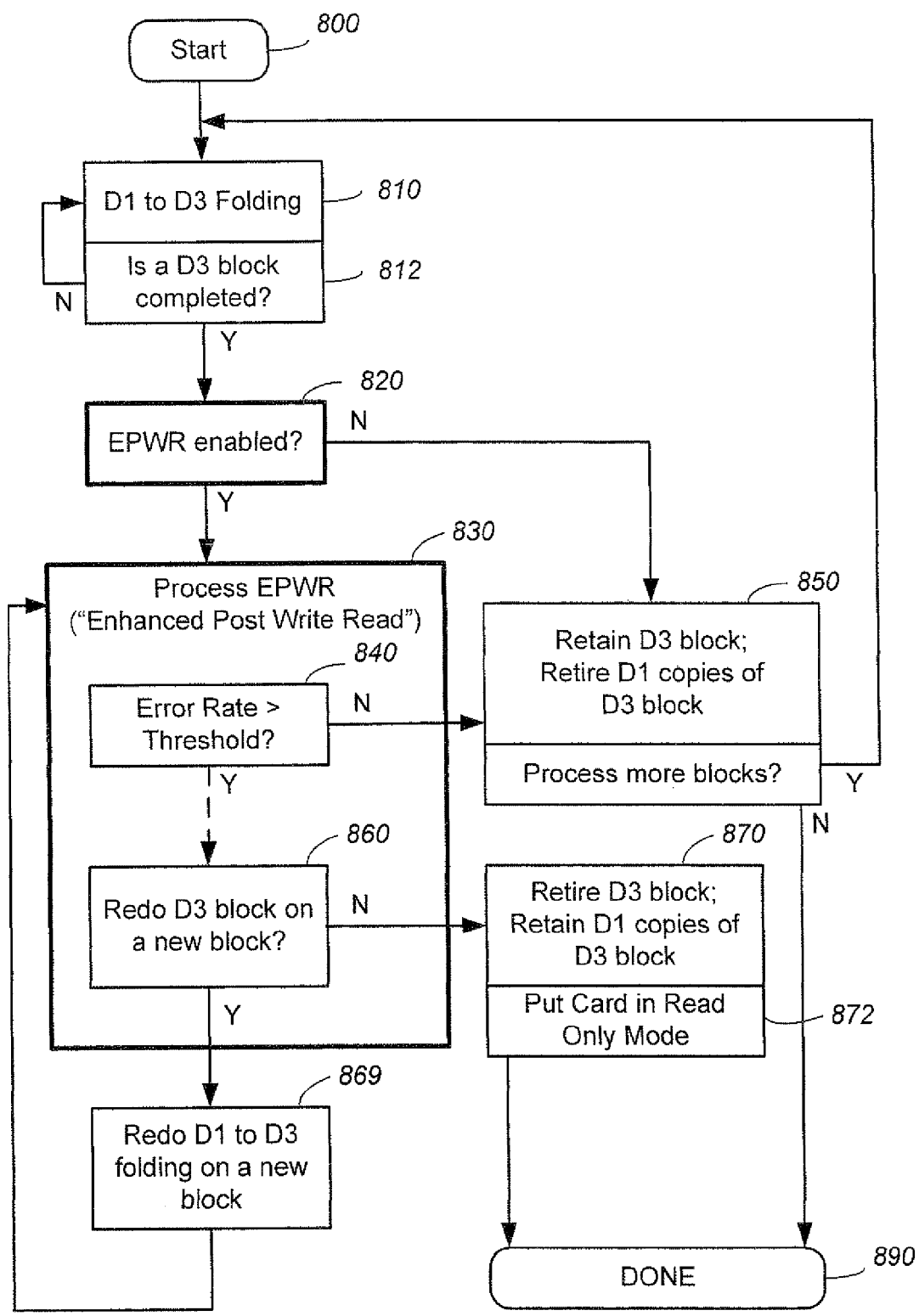
FIG. 22A is a flow diagram illustrating a preferred implementation of the EPWR error management as applied to a memory having D1 to D3 folding.

FIG. 22A is a flow diagram illustrating a preferred implementation of the EPWR error management as applied to a memory having D1 to D3 folding.

STEP 800: Start.

STEP 810: D1 to D3 Folding in which data from three binary data pages of D1 is programmed into one tertiary page of D3 as described in connection with FIG. 20A.

STEP 812: Is a D3 block completely filled? if completely filled, proceed to STEP 820, otherwise return to STEP 810.

STEP 820: Is enhanced post-write-read error management ("EPWR") enabled? More details of a device-age-dependent enablement is given in FIG. 22B. If EPWR is enabled, process EPWR in STEP 830. If not, the integrity of the D3 block written is unknown, but optimistically assumed to be good. Proceed to STEP 850.

STEP 830: Process EPWR. A more detailed implementation of EPWR is given in FIG. 22C.

STEP 840: At a higher level, essentially, the EPWR performs a post-write-read of the D3 block and test of the rate of ECC errors. If the errors does not exceed E_pw_check (see FIG. 21), the D3 block is good. Proceed to STEP 850. Otherwise, the data in the D3 block cannot be used and a retry of folding the D1 data to a new D3 block is considered. Proceed to STEP 860.

STEP 850: The D3 block is deemed good so the original copy of data in D1 can be made obsolete and retired.

STEP 860: Decide whether to retry on a new D3 block based on a number considerations detailed in FIG. 22C. If not permitted to retry, proceed to STEP 870. Otherwise proceed to STEP 862.

STEP 862: The D1 to D3 folding is repeated on a new D3 block. Return to process another block.

STEP 870: The data in the D3 block is deemed bad, so data must be accessed from original copy in D1.

STEP 872: Since this step is reached after a number of unsuccessful retries in attempting to rewrite the D3 block, the memory is deemed near end of it its life. It is put into a read-only state to prevent any data corruption due to programming operations. Proceed to STEP 890.

STEP 890: Done.

As described above, an ECC is typically designed to correct for any errors expected during the useful life of the memory. The errors come from a number of sources.

Figure 22B:
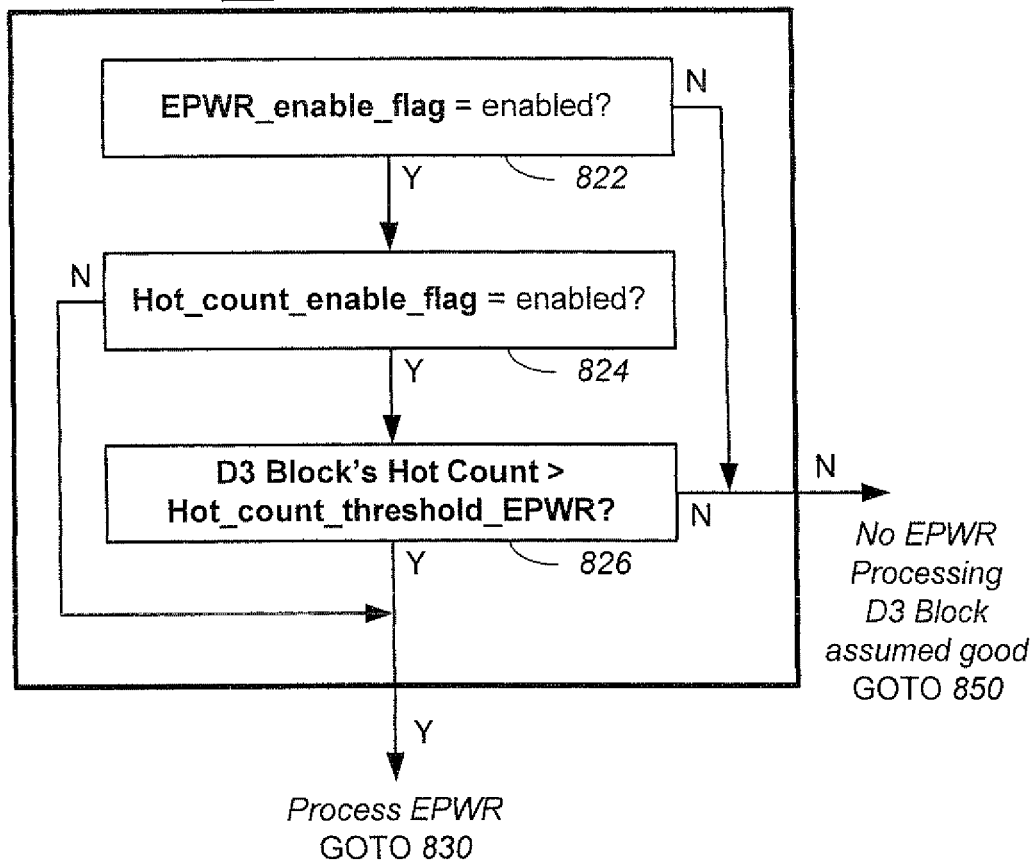
FIG. 22B illustrates in more detail the device-age-dependent enablement feature of the enhanced post-write-read error management.

FIG. 22B illustrates in more detail the device-age-dependent enablement feature of the enhanced post-write-read error management. The STEP 820 in FIG. 22A is shown in FIG. 22B to further include the following:

STEP 822: Check if the EPWR_enable_flag (see FIG. 21) is enabled. If not enabled, EPWR is not been implemented at all. Proceed by default to STEP 850 where the D3 block is deemed good. If enabled, proceed to STEP 824 to control if EPWR should commence after some aging of the memory device.

STEP 824: Check if the Hot_count_enable_flag (see FIG. 21) is enabled. If not enabled, EPWR is implemented from the beginning of life of the memory device. Proceed directly to STEP 830 to process EPWR. If the flag is enabled, proceed to STEP 826 which controls when EPWR should commence.

STEP 826: Check if any one of the D3 blocks has a hot count that exceeds the value in Hot_count-threshold_EPWR. If not exceeded the memory device is still young and not prone to excessive errors, proceed to STEP 850 and EPWR is essentially on hold. If the hot count has exceeded the threshold, the memory device has attained an age when errors becomes significant and will benefit from the EPWR process. Proceed to STEP 830 to process EPWR.

As described above, an ECC is typically designed to correct for any errors expected during the useful life of the memory. The errors come from a number of sources.

Figure 22C:
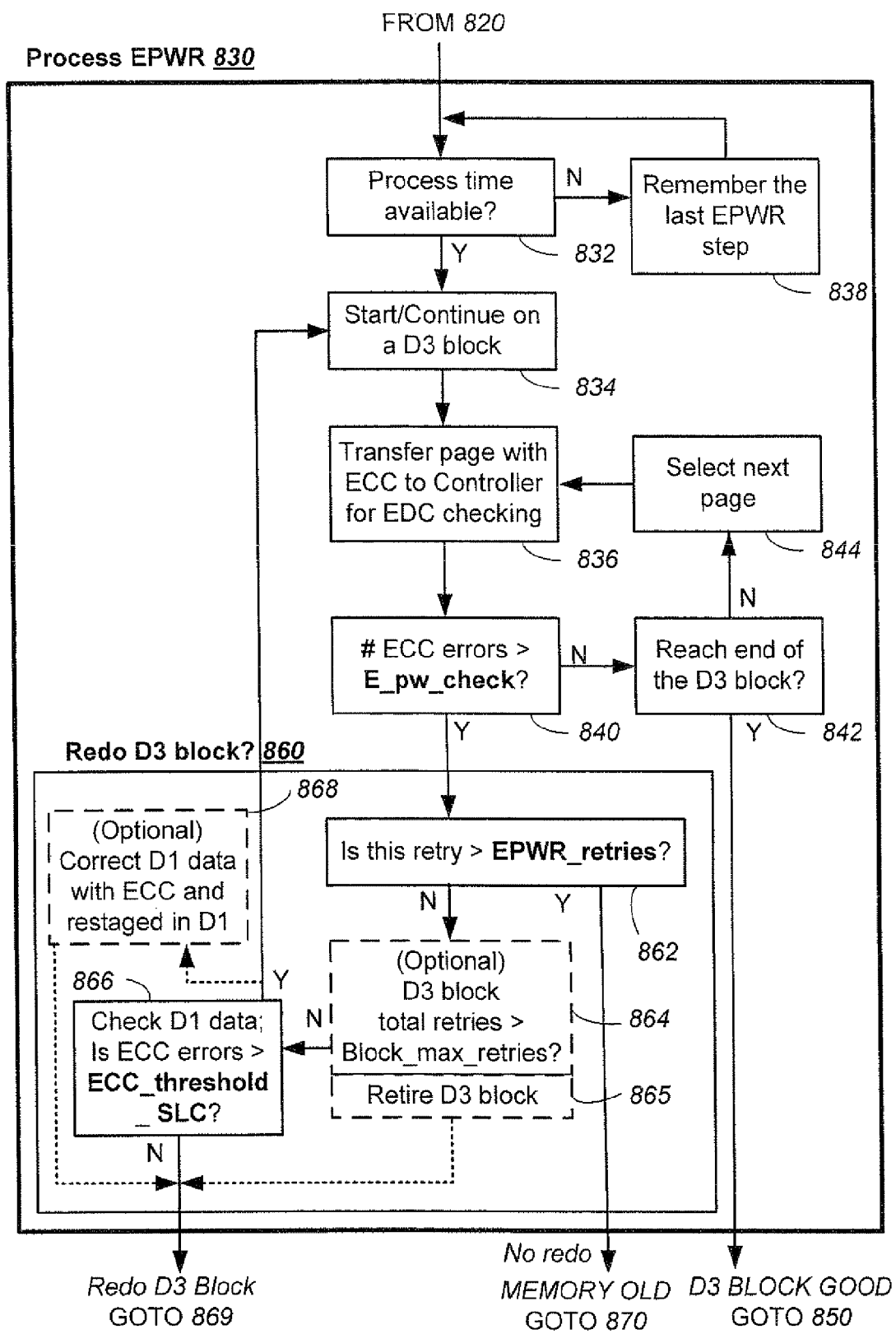
FIG. 22C illustrates in more detail a preferred implementation of the enhanced post-write-read error management.

FIG. 22C illustrates in more detail a preferred implementation of the enhanced post-write-read error management. The STEP 830 in FIG. 22A is shown in FIG. 22C to further include the following:

STEP 832: Check if there is process time available for doing post-write-read of the D3 block and possible retries. The available time is preferably taken from unused time during the execution of a host command in the foreground. If necessary the process can be broken down to smaller chunks so as to better utilize the spare time during each host command. If there is available time to start the process, proceed to STEP 834, otherwise, proceed to STEP 838.

STEP 834: Start the process or if the process has already been started but interrupted in the interim, continue the process.

STEP 836: Read and transfer a page of data from D3 out to the controller for checking EDC (error detection code). Proceed to STEP 838.

STEP 840: The EPWR performs a post-write-read of the D3 block and test of the rate of ECC errors. If the errors does not exceed E_pw_check (see FIG. 21), the page being tested is in D3 is good. Proceed to STEP 842. If a page is tested to be bad, the data in the D3 block cannot be used and a retry of folding the D1 data to a new D3 block is considered. Proceed to STEP 864.

STEP 842: Has all the pages in the D3 block been tested? If not, proceed to STEP 844 to process the next page. If the whole block is tested to be good, proceed to STEP 850.

STEP 844: Select the next page in the D3 block. Return to STEP 836.

STEP 862: Before a retry is attempted, check if the number of retries has already exceeded a set limit, EPWR_retries (see FIG. 21.) If not, a retry is attempted by proceeding to STEP 866. If the number of retries has exceeded the set limit, the memory device is deemed to be at its end of life and control proceeds to STEP 870.

STEP 866: Another consideration before attempting a retry is to check if the excessive errors are intrinsic to the data in D1 and not due to programming errors from D1 to D3. The D1 data is first checked for excessive ECC errors. If the number of error exceeded a predetermined threshold, such as, ECC_threshold_SLC (see FIG. 21), there is no point in a retry. Return to STEP 834 to process another D3 block.

However, if an optional feature as described below is implemented, proceed to an optional STEP 868 instead. On the other hand if the D1 data is good, proceed to attempt retry of another D3 block in STEP 869. In another embodiment, STEP 866 is performed before STEP 862.

FIG. 22C also illustrates optional features as indicated by boxes with broken lines. One option is illustrated by STEPs 864 and 865 to check if a block has been subjected too many retries over its lifetime. If so, the physical integrity of the block may be in question and it is best to retire the block so that it is not used again. When this option is implemented, the flow from a NO in STEP 862 will be routed to STEP 864.

STEP 864: Has the D3 block experience retries more than a threshold as defined by the parameter Block_max-retires (see FIG. 21). If so, proceed to STEP 865 to retire the block, otherwise proceed to STEP 866 for further rewrite decision.

STEP 865: The D3 block has be subjected to too many retries over its lifetime to be deemed robust. It is retired and taken out of circulation. Control then proceed directly to STEP 869 to rewrite the D3 block.

The other option is that in the event the D1 data is not very good, it is first corrected by ECC and restaged in D1 before being folded to D3. When this option is implemented, the flow from a YES in STEP 866 will be routed to STEP 868 instead of STEP 834.

STEP 868: The problematic D1 data is corrected by ECC and restaged in D1. Proceed to STEP 869.

Acceler

Previous sections have described the techniques of actually reading the data back after they have been written (also referred to as "programmed"). This technique is called "PWR" (Post Write Read). According to one aspect of the invention described earlier, the PWR technique is enhanced and is referred to as "EPWR" (Enhanced Post Write Read). In this case, the PWR operation is only turned on when needed. For example, PWR is initiated only after the memory begins to develop more errors through use. This will alleviate some of the overheads associate with PWR.

According to another aspect of the invention, instead of post-write reading every memory cells to check what have been written, which could consume a lot of time and system resources, the post-write read is only performed on a small sample of memory cells representing a population of memory cells with a similar error rate. When the post-write read of the sample yields an error rate within a predetermined, value, the population is assumed to pass the check. Otherwise, the data previously written on the population of cells are deemed to have too much error and are either rewritten again to a different location in the same area or to another area of the memory with intrinsic lower error rate.

As explained earlier, post-write read checking is different from the usual program verify that is part of programming operation. In programming a cell, it is subjected to pulse by pulse programming voltages. In between each pulse the cell's programmed threshold is compared to a reference read threshold. Once the cell's threshold is detected to be programmed passed the reference read threshold, the cell is locked out from further programming by a program inhibiting voltage applied to its bit line. Thus, program-verify only guarantee if the cell has been programmed pass a reference threshold but gives no indication of any over programming that may have occurred. A read operation for MLC memory actually checks if the programmed threshold is between a pair of reference thresholds.

In MLC memory each cell stores more than one bit of data. For example in D2 memory, each cell stores two bits of data. The threshold window supported by the cells is partitioned by a reference threshold into two halves. When the programmed threshold of a cell lies in a first half, it has one bit value, e.g., '1' and when in a second half, it has the other bit value, e.g., '0'. Similarly, in D3 memory, each cell stores three bits of data and in D4 memory, each cell stores four bits of data. In general, for a Dm memory, each cell stores m bits and the threshold window is partitioned into $2^m$ voltage bands by $2^m-1$ reference thresholds. A coding scheme is used to assign each of the voltage bands with an m-bit code word.

Exemplary Preferred "LM." Coding for a 2-Bit or 4-State Memory

Figure 23:
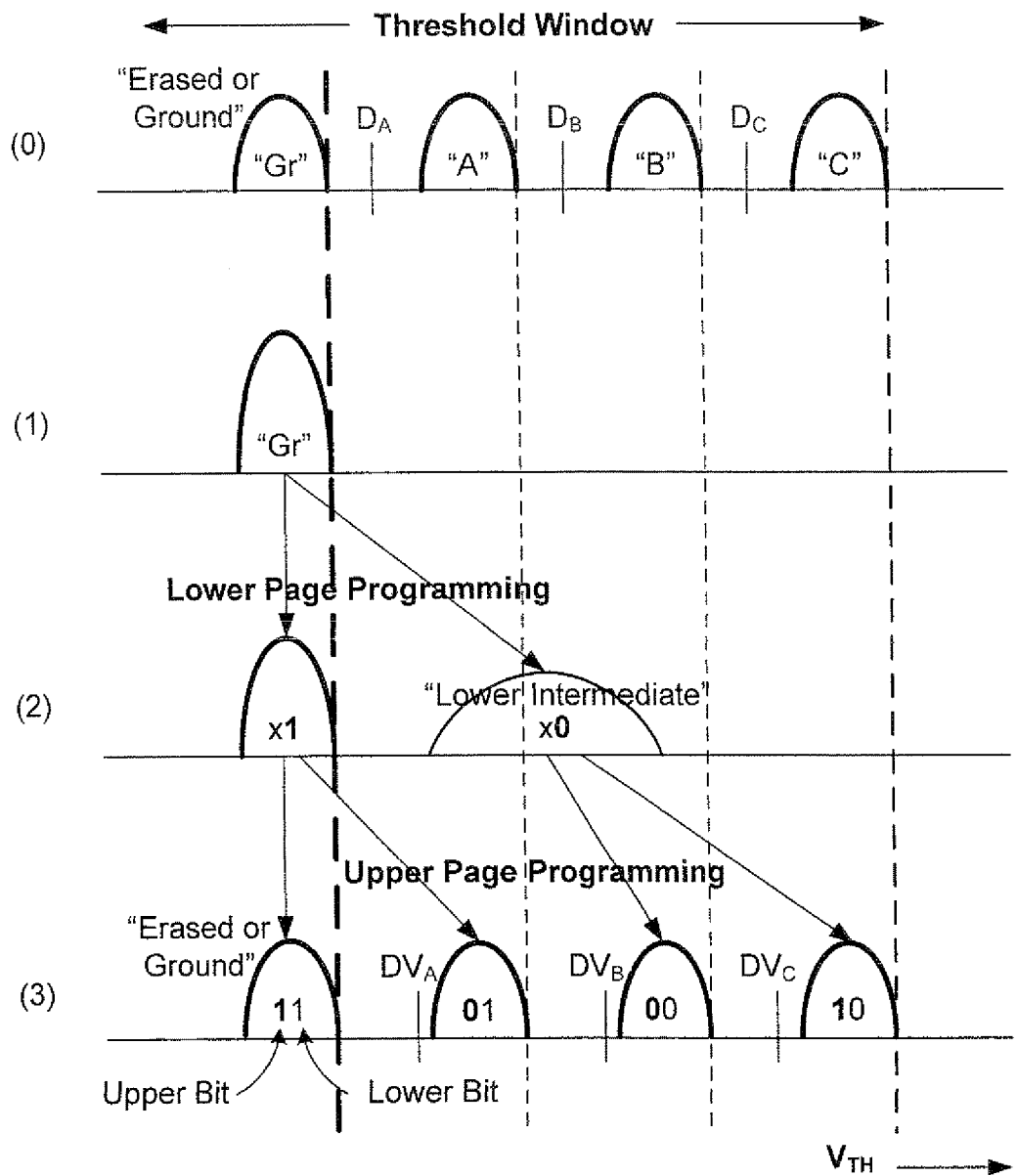
FIGS. 23(0)-23(3) illustrate a logical page by page programming of a 4-state memory encoded with a preferred 2-bit logical code ("LM" code).

FIGS. 23(0)-23(3) illustrate a logical page by page programming of a 4-state memory encoded with a preferred 2-bit logical code ("LM" code). The 2 code bits from each memory cell of a page form two logical pages with each page formed from one code bits contributed from every memory cells of the page. Programming can be performed logical-page by logical page with the lower page followed by the upper page. This code provides fault-tolerance and alleviates the BL-BL floating-gate coupling (Yupin) Effect.

FIG. 23(0) illustrates the threshold voltage distributions of a 4-state memory array. The possible threshold voltages of each memory cell span a threshold window which is partitioned into four regions to demarcate four possible memory states, "Gr", "A", "B" and "C". "Gr" is a ground state, which is an erased state within a tightened distribution and "A", "B" and "C" are three progressively programmed states. During read, the four states are demarcated by three demarcation reference thresholds, $D_A$, $D_B$ and $D_C$.

FIG. 23(3) illustrates a preferred, 2-bit LM coding to represent the four possible memory states. Each of the memory states (viz., "Gr", "A", "B" and "C") is represented by a pair of "upper, lower" code bits, namely "11", "01", "00" and "10" respectively. The EM coding differs from the conventional Gray code in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges. As will be seen in FIGS. 23(2) and 23(3), each programming operation results in moderate change of the charges in the charge storage unit as evident from the moderate change in the threshold voltages $V_T$.

The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

FIGS. 23(1) and 23(2) illustrate the lower page programming using the 2-bit LM code. The fault-tolerant LM code is designed to avoid any subsequent upper page programming to transit through any intermediate states. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a well-defined range of threshold values. The "lower intermediate" states may have a broad distribution of threshold voltages that straddle between memory states "A" and "B". During programming, the "lower intermediate" state is verified relative to a coarse demarcation such as $D_A$.

FIGS. 23(2) and 23(3) illustrate the upper page programming using the 2-bit LM code. The upper page programming is performed on the basis of the first round, lower page programming. A given upper bit can represent different memory states depending on the value of the lower bit. In the second round of programming, if a cell is to have the upper bit as "1" while the lower bit is at "1", i.e. (1,1), there is no programming for that cell and it remains in "Gr". If the upper bit is "0" while the lower bit is at "1", i.e., (0,1), the cell is programmed from the "Gr" state to the "A" state. During programming to "A", the verifying is relative to the demarcation $DV_A$. On the other hand, if the cell is to have the upper bit as "0" while the lower bit is at "0", i.e., (0,0), the cell is programmed from the "lower intermediate" state to "B". The program verifying is relative to a demarcation $DV_B$. Similarly, if the cell is to have the upper bit as "1" while the lower page is at "0", i.e., (1,0), the cell will be programmed from the "lower intermediate" state to "C". The program verifying is relative to a demarcation $DV_C$. Since the upper page programming only involves programming to the next adjacent memory state from either the "Gr" state or the "lower intermediate" state, no large amount of charges is altered from one round to another. Also, the lower page programming from "Gr" to a rough "lower intermediate" state is designed to save time.

Figure 24A:
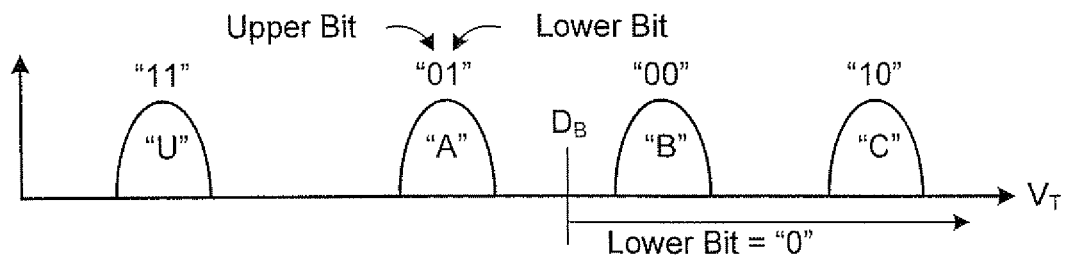
FIG. 24A illustrates the read operation that is required to discern the lower bit of the 4-state memory encoded with the 2-bit LM code.

FIG. 24A illustrates the read operation that is required to discern the lower bit of the 4-state memory encoded with the 2-bit LM code. The decoding will depend on whether the upper page has been programmed or not. If the upper page has been programmed, reading the lower page will require one read pass of readB relative to the demarcation threshold voltage $D_B$. On the other hand, if the upper page has not yet been programmed, the lower page would be programmed to the "intermediate" state (see FIG. 23(2)), and readB would cause error. Rather, reading the lower page will require one read pass of readA relative to the demarcation threshold voltage $D_A$. In order to distinguish the two cases, a flag ("LM" flag) is written in the upper page (usually in an overhead or system area) when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 24B:
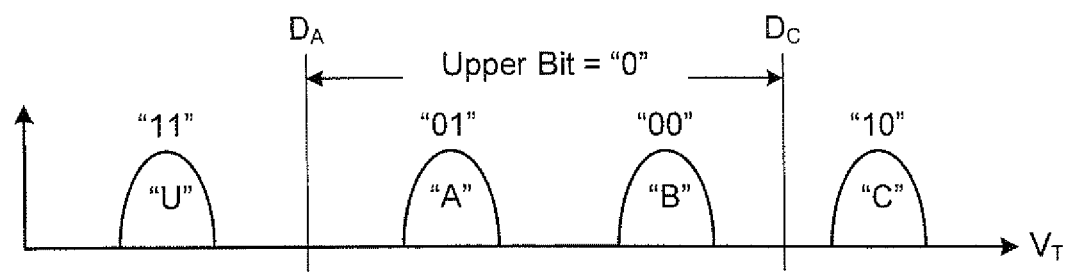
FIG. 24B illustrates the read operation that is required to discern the upper bit of the 4-state memory encoded with the 2-bit LM code.

FIG. 24B illustrates the read operation that is required to discern the upper bit of the 4-state memory encoded with the 2-bit LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

If the read is to scan through all sequence of the demarcated states as in a "full-sequence" read or "all-bit" read, the read is performed relative to the memory states "Gr", "A", "B" and "C" demarcated respectively by reference threshold voltages $D_A$, $D_B$ and $D_C$. As all possible states are differentiated by the full-sequence read, there is no need to check for any LM flag. In this mode of read, all bits are determined together.

Exemplary Preferred "LM" Coding for a 3-Bit or 8-State Memory

The example for the 2-bit LM code can be similarly extended to 3-bit or high number of bits.

Figure 25:
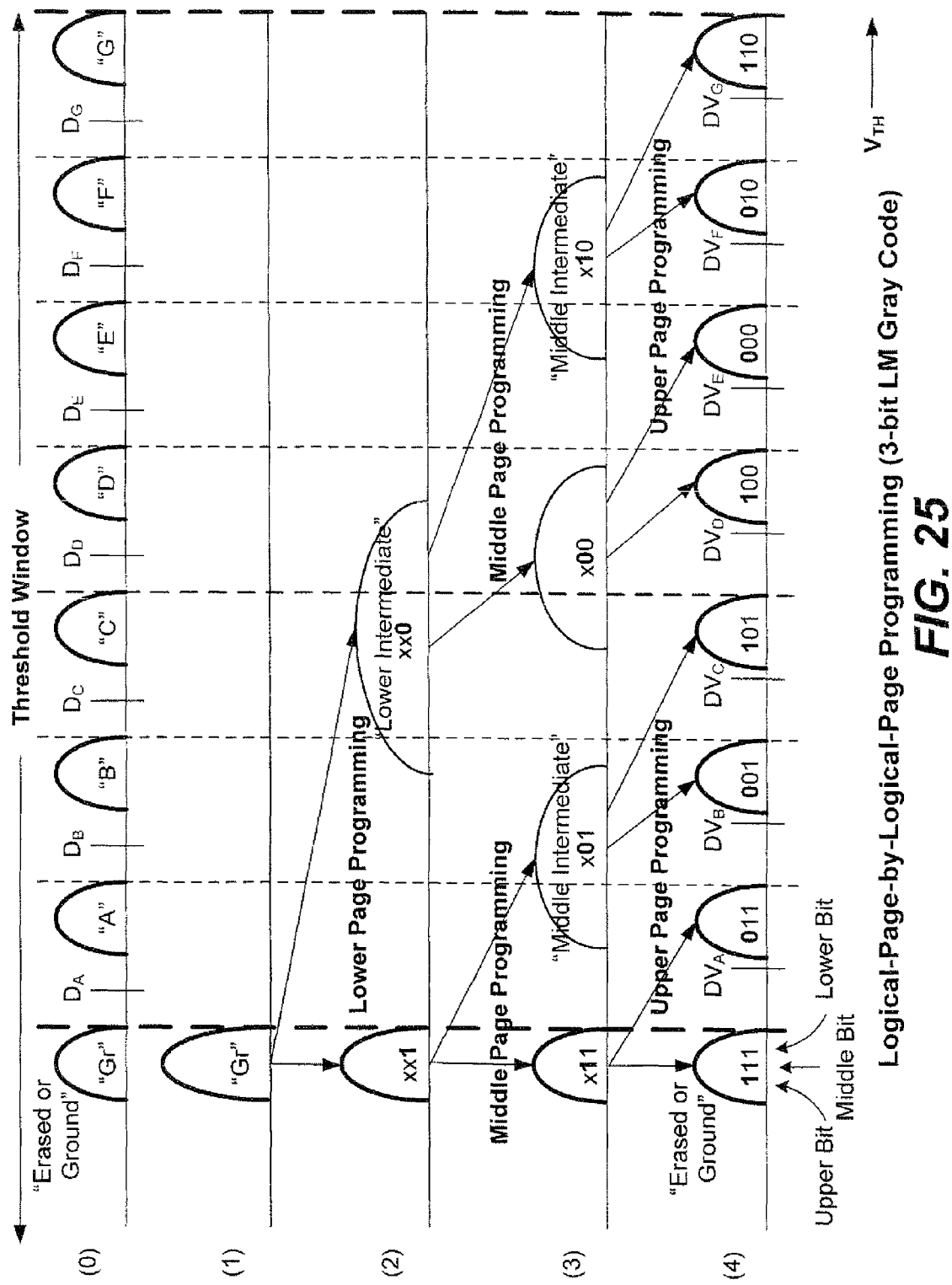
FIGS. 25(0)-25(4) illustrate the programming of an 8-state memory encoded with a preferred 3-bit logical code ("LM" code).

FIGS. 25(0)-25(4) illustrate the programming of an 8-state memory encoded with a preferred 3-bit logical code ("LM" code). The 3 bits from each memory cell of a page forms three logical pages and programming can be performed logical-page by logical page. This code is similar to the 2-bit LM coding described earlier and is an extension into 3 bits to encode eight possible memory states. FIG. 25(0) illustrates the threshold voltage distributions of an 8-state memory array. The possible threshold voltages of each memory cell spans a threshold window which is partitioned into eight regions to demarcate eight possible memory states, "Gr", "A", "B", "C", "D", "E", "F" and "G". "Gr" is a ground state, which is an erased state within a tightened distribution and "A"-"G" are seven progressively programmed states. During read, the eight states are demarcated by seven demarcation reference thresholds, $D_A$-$D_G$.

FIG. 25(4) illustrates a preferred, 3-bit LM coding to represent the eight possible memory states. Each of the eight memory states is represented by a triplet of "upper, middle, lower" bits, namely "111", "011", "001", "101", "100", "000", "010" and "110" respectively. As will be seen in FIGS. 25(1) and 25(4), each programming operation results in moderate change in the charges in the charge storage unit as evident from the moderate change in the threshold voltages $V_T$.

The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse demarcation reference threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

In general a page of memory cells is being programmed in parallel, with each memory cell having 3 bits. Thus, the page of memory cells may be regarded as having 3 logical data pages with each logical data page contributed from one code bit of every cells of the page. Thus, a "lower bit" page is formed from the lower bit of every memory cells of the page, a "middle bit" page is formed from the middle bit of every cell and an "upper bit" page is formed from the upper bit of every cell of the page.

FIGS. 25(1) and 25(2) illustrate the lower page programming using the 3-bit LM code. The fault-tolerant LM code is designed to avoid any subsequent higher page programming to transit through any intermediate states. Thus, the first round, lower page programming has a cell remain in the "erased" or "Gr" state if the lower bit is "1", i.e. (x,x,1) or programmed to a "lower intermediate" state if the lower bit is "0", i.e., (x,x,0). Basically, the "Gr" or "ground" state is the "erased" state with a tightened distribution by having the deeply erased states programmed to within a well-defined range of threshold values. The "lower intermediate" states may have a broad distribution of threshold voltages that straddling between memory states "B" and "D". During programming, the "lower intermediate" state is verified relative to a demarcation such as $D_B$.

FIGS. 25(2) and 25(3) illustrate the middle page programming using the 3-bit LM code. The middle page programming is performed on the basis of the first round, lower page programming. A given middle bit can represent different memory states depending on the lower bit. In the second round of programming, if a cell is to have the middle bit as "1" while the lower bit is at "1", i.e. (x,1,1), there is no programming for that cell and it remains in "Gr". If the middle bit is "0" while the lower bit is at "1", i.e., (x,0,1), the cell is programmed from the "Gr" state to a first "middle intermediate" state straddling between "A" and "B". During programming to the first "middle intermediate" state, the verifying is relative to the demarcation $DV_A$. On the other hand, if the cell is to have the middle bit as "0" while the lower bit is at "0", i.e., (x,0,0), the cell is programmed from the "lower intermediate" state to a second middle intermediate" state straddling between "C" and "D". The program verifying is relative to a demarcation $DV_C$. Similarly, if the cell is to have the middle bit as "1" while the lower page is at "0", i.e., (x,1,0), the cell will be programmed from the "lower intermediate" state to a third "middle intermediate" state straddling between "E" and "F". The program verifying is relative to a demarcation $DV_E$.

FIGS. 25(3) and 25(4) illustrate the upper page programming using the 3-bit LM code. The upper page programming is performed on the basis of the first and second rounds, namely the lower and middle page programming. A given upper bit can represent different memory states depending on the lower and middle bits. In the third round of programming, if a cell is to have the upper bit as "1" while the lower and middle bits are at "1", i.e. (1,1,1), there is no programming for that cell and it remains in "Gr". On the other hand, if the upper bit is "0" while the lower and middle bits are at "1", i.e. (0,1,1), the cell is programmed from the "Gr" state to the "A" state. During programming to "A", the verifying is relative to the demarcation $DV_A$.

Similarly, if the cell is to have the upper bit as "0" while the lower bit and middle bits are at "0" and "1" respectively, i.e. (0,0,1), the cell is programmed from the first "middle intermediate" state to "B". The program verifying is relative to a demarcation $DV_B$. If the cell is to have the upper bit as "1" while the lower bit and middle bits are at "0" and "1" respectively, i.e. (1,0,1), the cell is programmed from the first "middle intermediate" state to "C". The program verifying is relative to a demarcation $DV_C$.

Similarly, if the cell is to have the upper bit as "1" while the lower bit and middle bits are at "0" and "0" respectively, i.e. (1,0,0), the cell is programmed from the second "middle intermediate" state to "D". The program verifying is relative to a demarcation $DV_D$. If the cell is to have the upper bit as "0" while the lower bit and middle bits are at "0" and "0" respectively, i.e. (0,0,0), the cell is programmed from the second "middle intermediate" state to "E". The program verifying is relative to a demarcation $DV_E$.

Similarly, if the cell is to have the upper bit as "0" while the lower bit and middle bits are at "1" and "0" respectively, i.e. (0,1,0), the cell is programmed from the third "middle intermediate" state to "F". The program verifying is relative to a demarcation $DV_F$. If the cell is to have the upper bit as "1" while the lower bit and middle bits are at "0" and "0" respectively, i.e. (1,1,0), the cell is programmed from the third "middle intermediate" state to "G". The program verifying is relative to a demarcation $DV_E$.

Since the upper page programming only involves programming to the next adjacent memory state from either the "Gr" state or one of the "middle intermediate" states, no large amount of charges is altered from one round to another. This helps to alleviates BL-BL Yupin effect.

Thus, it will be seen that a Dm (m=1, 2, 3, ...) memory can be programmed a bit at a time and also read a bit at a time. When a group of memory cells on a word line WLn are programmed or read in parallel, there will be m data pages associated with the group, with each data page corresponding to one bit from each cells of the group. In a progressive reading mode, the sensing is relative to a subset of the reference thresholds and at each sensing only one of the m data pages are read from WLn and transferred out to the controller. In a full sequence reading mode, the sensing is relative to all the reference thresholds and all m data pages are read from WLn before being transferred out page by page.

For example, in the case of a memory with the NAND architecture shown in FIG. 4, each NAND string has a daisy chain of n memory cell. In one embodiment, a row of such NAND chains forms an erase block 300 shown in FIG. 6. In FIG. 4, a page of memory cells, such as page 70 on WL3, is operated on in parallel.

FIG. 9 shows a data page 70' being one of the m data pages for an m-bit memory on word line WLn. As described earlier, in another preferred embodiment, when with higher and higher device integration, there are larger than optimal number of memory cells in a page sharing an ECC field, the page 70 is partitioned into smaller units, consisting of "ECC pages".

Figure 26A:
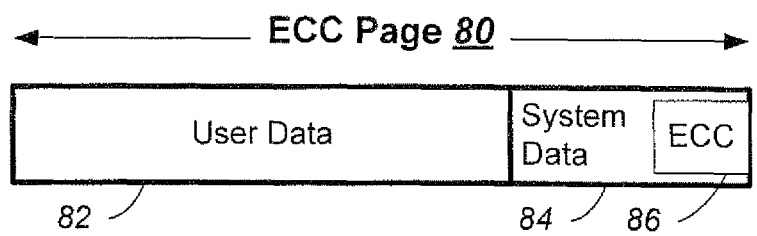
FIG. 26A illustrates schematically an ECC page containing an ECC field similar to that shown in FIG. 9.

FIG. 26A illustrates schematically an ECC page containing an ECC field similar to that shown in FIG. 9. The ECC page 80 comprises a user portion 82 and a system portion 84. The user portion 82 is for storage of user data. The system portion 84 is generally used by the memory system for storage of system data. Included in the system data is an ECC. The ECC is computed for the ECC page. Typically, the ECC is computed by the ECC processor 62 in the controller 102 (see FIG. 1.) The difference between FIG. 26A and FIG. 9 is that instead of the ECC page 80 of occupying the entire data page 70', it is one of several constituting the data page.

Figure 26B:
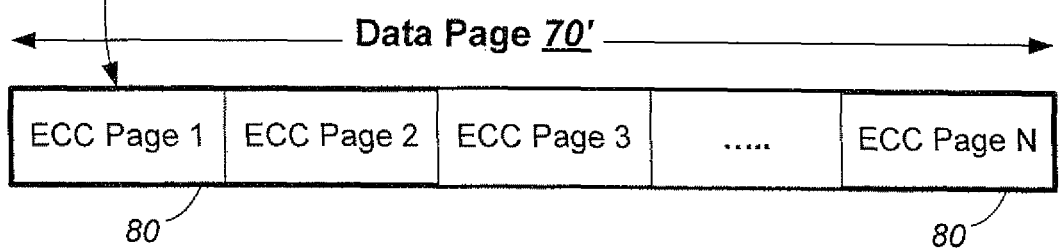
FIG. 26B illustrates a plurality of ECC pages constituting a data page.

FIG. 26B illustrates a plurality of ECC pages constituting a data page. A data page such as the data page 70' shown in FIG. 4 is the set of data constituted from a logical bit from each cell of a page of cells on a WL. In general there are N EEC pages making up a data page. For example, N=4, where there are 4 EEC pages 80 making up one data page 70'.

As data is received from a host, an ECC page of data is staged in the controller 102 and its ECC 86 is computed by the EEC processor 62 (see FIG. 1). A number of ECC pages 80 incorporating they own ECC is then staged and written to the memory array 200 as a data page 70'. Typically, when the data page 70' is read, the data page is latched in the data latches 430 and shifted out of the I/O circuits 440 to the controller 102. At the controller 102, each ECC pages of the data page's has its EEC 86 compared to a second version of the ECC computed on the read data. The ECC typically includes an error detection code ("EDC") for rapid detection of any error in the data page. If the EDC indicates the existence of any error in the read data page, the ECC is invoked to correct erroneous bits in the read data page. The ECC is designed to correct up to a predetermined maximum number of errors. In practice, at any given time in the life of a memory, the ECC may have budget to correct a predetermined number of errors less than the predetermined maximum.

For a 2-bit memory, each cell stores 2 bits of data and there will be 2 data pages associated with each WL in the example in FIG. 4. If each data page has 4 ECC pages, then there will be a total of 8 ECC pages programmed into a WL and to be read out for PWR checking.

Similarly for a 3-bit memory, each cell stores 3 bits of data and there will be 3 data pages associated with each WL in the example in FIG. 4. If each data page has 4 ECC pages, then there will be a total of 12 ECC pages programmed into a WL and to be read out for PWR (post-write read) checking.

Thus, it will be seen for a 3-bit memory that performing a PWR check after writing every WL can involve sensing the 12 ECC pages and then shipping out to the controller for ECC checking. If the ECC decoder finds any one of the 12 ECC pages has exceeded a predetermined error budget, the write to that WL is deemed unacceptable and is retried at a different WL. For example, the write is rewritten to another WL in the same block or in a portion of memory, such as with one-bit cells, having a higher tolerance for errors.

In the 3-bit memory example, there are 3 data page to be sensed. As seen from the description in connection with FIG. 25, this will incur 3 read cycles, one for each data page. Each read cycle will be sensing relative to one or more reference thresholds and therefore reading the WL will take time. Furthermore, each data page has 4 ECC pages and a total of 12 ECC pages will need to be serially transferred out to the controller. The transfer operations will also take time, if not more time than the sensing operations.

PWR Checking on a Sample Instead of the Whole Population

In a general embodiment of the invention, the post-write read (PWR) checking on what has been written is accelerated by checking only a subset of what has been written. The post-write read checking is performed on only a sample of what was written.

Figure 27:
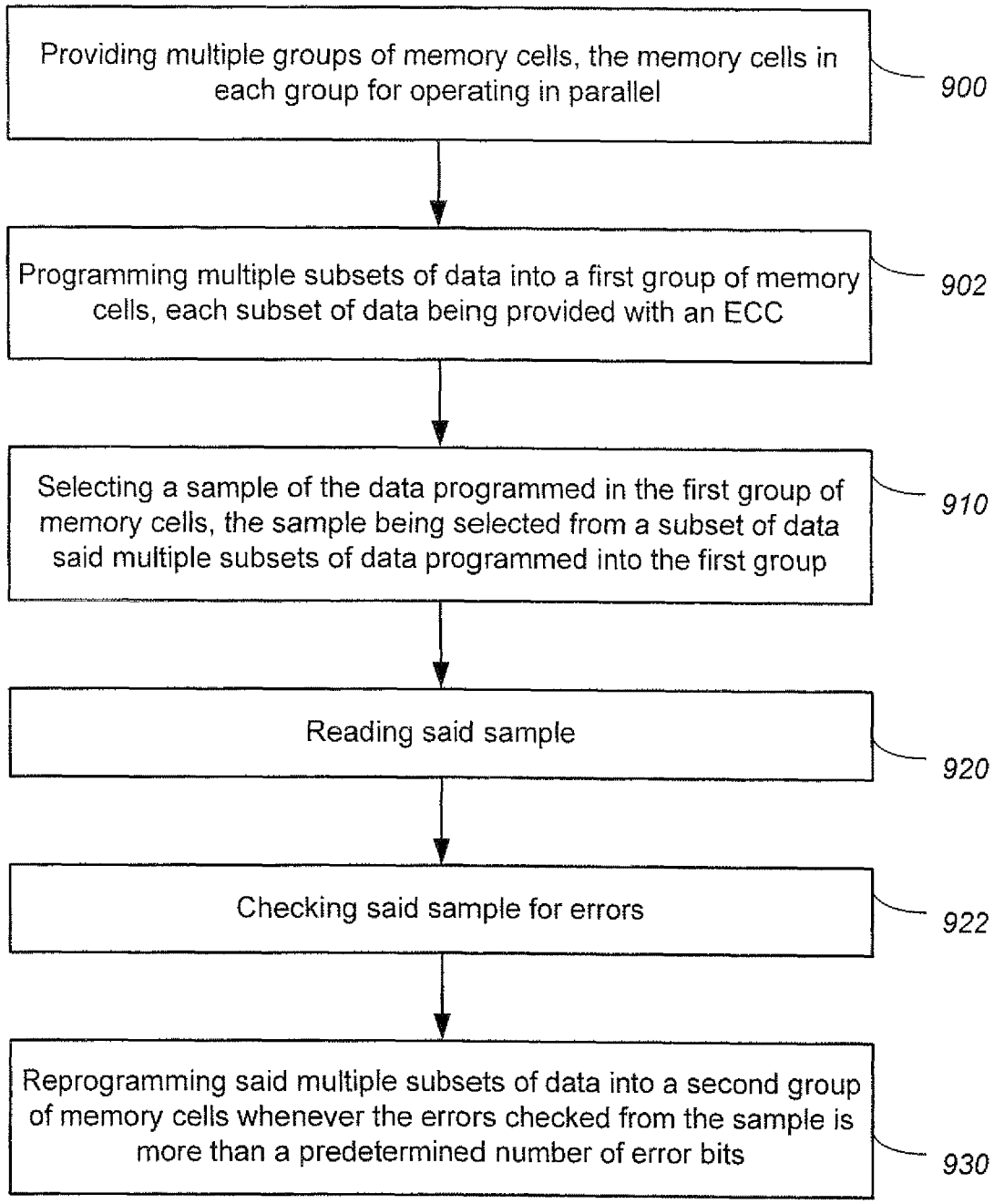
FIG. 27 is a flow chart illustrating the general embodiment of accelerated PWR.

FIG. 27 is a flow chart illustrating the general embodiment of accelerated PWR.

STEP 900: Providing multiple groups of memory cells, the memory cells in each group for operating in parallel.

STEP 902: Programming multiple subsets of data into a first group of memory cells, each subset of data being provided with an ECC.

STEP 910: Selecting a sample of the data programmed in the first group of memory cells, the sample being selected from a subset of data said multiple subsets of data programmed into the first group.

STEP 920: Reading said sample.

STEP 922: Checking said sample for errors.

STEP 930: Reprogramming said multiple subsets of data into a second group of memory cells whenever the errors checked from the sample is more than a predetermined number of error bits.

In one embodiment, the sample to be check is a subset of all the ECC pages written to a group of cell on a word line. In particular, the subset is one among all the ECC pages that is estimated to have a highest error rate.

Figures 28, 29:
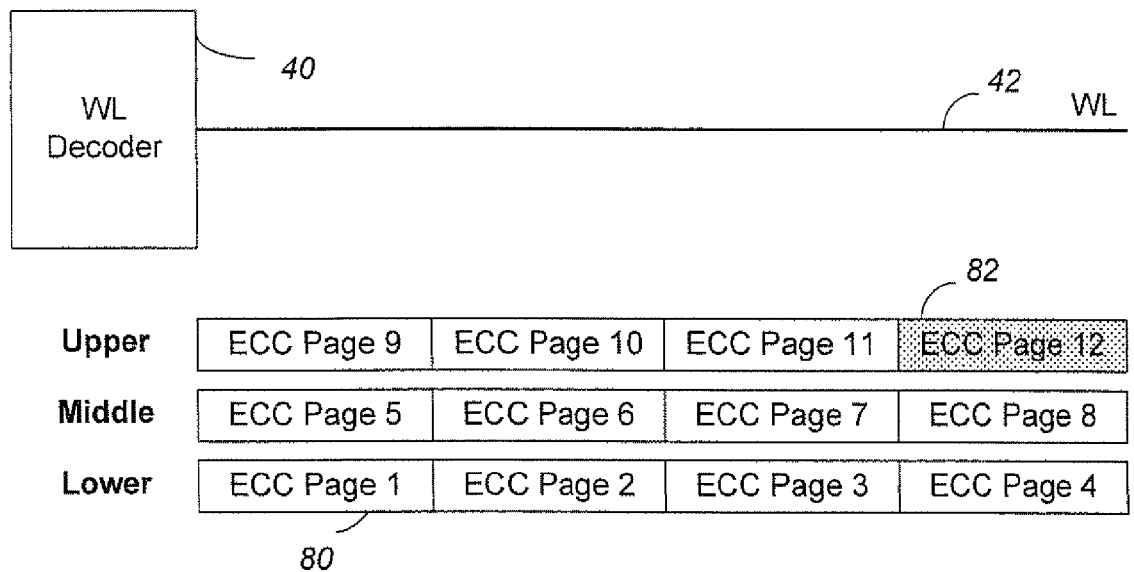
FIG. 28 is a flow chart illustrating a preferred embodiment of accelerated PWR illustrated in FIG. 27.
FIG. 29 illustrates a sample selected for post-write read after a group of 3-bit memory cells on a word line has been written.

FIG. 28 is a flow chart illustrating a preferred embodiment of accelerated. PWR illustrated in FIG. 27. The process is similar to that of FIG. 27, except STEP 910 is replaced by STEP 910'.

STEP 910': Selecting a sample of the data programmed in the first group of memory cells, the sample being selected from a subset of data said multiple subsets of data programmed into the first group and the sample is a subset of data estimated to have a highest error rate among said multiple subsets of data programmed into the first group.

FIG. 29 illustrates a sample selected for post-write read after a group of 3-bit memory cells on a word line has been written. In the 3-bit memory, there will be 3 data pages, namely, lower, middle and upper pages, written to a word line WL 42. Depending on the designed placement of the reference thresholds that demarcate the various voltage bands in the threshold window of the memory, one of the data pages may have a slightly higher error rate than the other. For example, if the upper data page has an estimated highest data rate among the three data pages, it will be selected. If all the ECC pages in the selected data page are estimated to have the same error rate, then it suffices to select an ECC page with a location that is the first to be shifted out to the controller.

In practice, the error on a word line could be due to a physical defect like a crack resulting in an open circuit or one with an unusually high resistance. If the defect occurs between the cell in question and the WL decoder, the check will show an error. If the defect occurs on the other side of the cell away from the WL decoder, then, the check may not show an error. Thus, among all the ECC pages along the WL 42, the sample ECC page 82 at the end of the WL furthest from the WL decoder 40 is likely to be impacted by the defect irrespective of the defect location on the WL.

Thus, in a preferred embodiment where there are multiple data pages written to a word line (WL), a sample used for checking the data written to the WL is first selected from a data page with highest estimated error rate. Furthermore, if there are multiple ECC pages in the selected data page, the ECC page located furthest away from a word line decoder is selected for the sample.

In another embodiment, the sample to be check is a subset of all the ECC pages written to a group of cells in a block. The block has all cells in it erasable together. In particular, the subset is one among all the ECC pages that is estimated to have a highest error rate.

For example, in the NAND memory shown in FIG. 4, an erase block is constituted from a row of NAND chains. Each NAND chain is 16 memory cells daisy-chained by their sources and drains, terminating on one end in a source terminal and the other end in a drain terminal. It is well-known that the cells in closest to the source terminal and the drain terminal are more error prone. Thus, for such a block, the word lines WL1 or WL16 should be selected. In this case, preferably, the sample is the ECC page at the end of WL1 furthest from the word line decoder.

In yet another embodiment, where a block of memory cell having a set of word lines is erasable as a erase unit, and there is a requirement that data written to each word line of the set must check out, or else the entire block is rewritten, the WL of the set estimated to have the highest error rate is preferentially checked first. In this way, any error that may occur will be detected early and the rewriting of the block can begin without delay.

Thus, for the NAND memory shown in FIG. 4, the word lines WL1 and WL16 should be selected first for checking.

Although an example is given for a memory being partitioned into a first portion having memory cells each storing 1-bit data and a second portion having memory cells each storing 3-bit data, the invention is not limited by the example.

Configurable Accelerated EPWR

As discussed above with respect to the embodiments using STEP 910 and STEP 910' (respectively of FIG. 27 and FIG. 28), when selecting a sample to check as part of the Enhanced Post Write Read (EPWR) process, the system will select the sample expected to have the highest error rate. In the preceding discussion, the EPWR embodiments would use a fixed choice for what this sample would be and use this across the life cycle of the device when enhanced EPWR was enabled. For example, the fixed physical ECC page of the uppermost page of word lines in multi-stare blocks would be read throughout the life cycle of the device. A drawback of this arrangement is that over the life of a device, the most common failure modes can change, so that although the top page may be the best choice for much of the time, in other cases errors may be more readily detected based on a different page or multiple pages of the corresponding cells. Consequently, selecting a sample that stays the same across a device's life cycle may not catch fails existing on the unchecked pages residing on the same word line. On the other hand, though, changing the arrangement of the previous section to check all the pages in the word line throughout the life cycle of the card would result in severe performance degradation and could also lead to misdetection, especially at higher hot counts value (number of program-erase cycles or experience count).

The embodiments of this section present a configurable EPWR arrangement, in which page or pages (such as lower, middle, upper, or some combination of these in a 3-state block) are checked is configurable based on different Not Count ranges. The exemplary embodiment does this through a file in the system which can dynamically change the page(s) to check based upon the current value the hot count.

For example, during the device characterization process, the testing can establish various likelihood of different failure modes across hot count valued. Based this and the samples best suited to manifest these errors when read, the pages to read as a function of hot can be set, with the information the file system (such as described above with respect to FIG. 21) now expanded to include this information.

Having the ability to control which pages to check during EPWR through a file gives the memory system the flexibility of tuning the performance according to the product requirement, which could be varied. This also allows for the ability to reduce the frequency of defective parts by basing the control of checking the appropriate pages during EPWR using a file, instead of having to resort to code modification. This arrangement also helps to speed up the testing process for devices.

As a specific example, a 3-bit per cell embodiment is considered, where each word line can store an upper, middle, and lower is any of the codes discussed in earlier sections. Each word line is taken to have 8 2K ECC pages and the array is split into two logical planes and the word line drivers can alternate between the left and right sides for blocks as shown in FIG. 30 (the first 7 blocks are shown), which can be taken as schematically extending what is shown in FIG. 29. As discussed near the end of the preceding section with respect to FIG. 29, the ECC page furthest from the WL driver is selected for checking as this is more likely to detect a broken word line so that the system will check the ECC pages on logical plane 1 when the physical block number is even and check the ECC pages on logical plane 0 when the physical block number is odd. The Lower/Middle/Upper notation is to indicate that data corresponding to any of these pages can be selected for checking: Which pages (lower, middle or upper page) to check can depends on different hot count range of a given MLC block can be controlled in file system configuration file.

In the exemplary embodiment, the file parameters used specify hot count threshold value ranges and which pages to check. FIG. 31 illustrates an example of the variables that can be set in the file. The example uses three hot count ranges, although different numbers of ranges can be used. 2 bytes can be used for each of the ranges, with 3 bits (1 bit for each page) to indicate which pages to be checked and 13 bits to specify the range. Any combination of the 3 pages (or no page) can be specified in each range. In FIG. 31 the first range is for a hot count of 0-100, with the upper and middle page being checked; the second range is set at hot count values 101-150, with just the upper page being checked; and the third range is set for a hot count of 151 and higher, with the uppermost page again being checked. Here both upper and middle pages are checked when the device is relatively fresh, as so that errors that manifest themselves on either page can be picked up. At higher counts, the middle page is dropped out as upper page defects come to be dominant and also as checking the top and middle page may over-detect the amount of error which the system can actually handle through ECC, dynamic read, and other methods. If the 3 bits specifying the pages to check are set to [000], this is no EPWR in the corresponding hot count range. If these bits are set at [000] for all ranges, there will no EPWR for the whole range even if the EPWR_enable_flag (see FIG. 21) is set. Based on the result of the check, the firmware can then proceed as in the sections above.

The values of the hot count ranges and also which pages to check can be determined as part of the device characterization process. Based on test results, the failure modes and how these vary with the hot count can be established. The corresponding pages and hot count ranges can then be set in the file of each device before it is shipped.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method of operating a memory system including a non-volatile memory circuit formed of one or more blocks of non-volatile memory cells, the block being a minimum erase unit, where each of the blocks includes one or more groups of memory cells that can be operated in parallel, the method comprising:

for each of the blocks, maintaining by the memory system of an experience count indicative of the number of erase-program cycles that the corresponding block has experienced;

maintaining by the memory system of a file wherein, for at least first and second non-overlapping ranges of experience counts, a corresponding first and second sample of data in a group of previously programmed memory cells is to be selected for a post-write process, wherein the file is configurable so that the first and second samples can be configured independently;

programming multiple subsets of data into a first group of memory cells, each subset of data being provided with an ECC;

subsequent to said programming, selecting by the memory system of a sample of the data programmed in the first group of memory cells from said multiple subsets of data programmed into the first group, wherein the selecting of a sample includes:

determining whether the corresponding experience count for the first group of memory cells corresponds to one of the first or the second non-overlapping ranges of experience counts; and selecting a sample based on the sample corresponding to the determined experience count in the file;

reading the selected sample;

checking the selected sample as read to determine an amount of error therein, and reprogramming said multiple subsets of data into a second group of memory cells whenever the amount of error determined from the selected sample is more than a predetermined number of error bits.

2. The method as in claim 1, wherein:
each memory cell of the first group stores n bits of data;
said programming multiple subsets of data stores n data pages into the first group of memory cells, each data page constituted by one bit from each memory cell in the first group.

3. The method of claim 2, wherein the first and second samples share elements.

4. The method of claim 3, wherein the first sample is data corresponding to multiple pages from a first plurality of memory cells and the second sample is data corresponding to single page from the first plurality of memory cells.

5. The method of claim 4, wherein the second sample is data corresponding to the uppermost page of data from the first plurality of memory cells and the first sample is data corresponding the uppermost page of data and a middle page of data from the first plurality of memory cells.

6. The method of claim 2, wherein the first and second samples do not share any elements.

7. The method of claim 6, wherein the first sample is data corresponding to a first page from a first plurality of memory cells and the second sample is data corresponding to second page from the first plurality of memory cells, the first and second pages being different.

8. The method of claim 7, wherein the second sample is data corresponding to the uppermost page of data from the first plurality of memory cells.

9. The method as in claim 2, wherein n is equal to 3.

10. The method as in claim 1, wherein:
the first group of memory cells resides on a word line.

11. The method as in claim 1, wherein:
the first group forms a block.

12. The method as in claim 1, wherein:
said checking for errors include checking the ECC of the selected sample to determine the number of error bits.

13. The method as in claim 1, further comprising:
configuring said non-volatile memory into first and second portions, the first portion having memory cells operating with less error rate but lower density storage compared to the second portion; and wherein:
said first and second groups of memory cells are in the first portion; and
said second group of memory cells is in the second portion.

14. The method as in claim 1, further comprising:
configuring said non-volatile memory into first and second portions, the first portion having memory cells operating with less error rate but lower density storage compared to the second portion; and wherein:
said first group of memory cells is in the first portion; and
said second group of memory cells is in the second portion.

15. The method as in claim 1, wherein:
the memory is further organized into multiple rows of NAND chains;
each NAND chain being a column of a string of daisy-chained memory cells terminating at a source terminal and a drain terminal; and
the selected sample is a subset of data stored at memory cells closest to the source terminal of each NAND chain.

16. The method as in claim 1, wherein:
the memory is further organized into multiple rows of NAND chains;
each NAND chain being a column of a string of daisy-chained memory cells terminating at a source terminal and a drain terminal; and
the selected sample is a subset of data stored at memory cells closest to the drain terminal of each NAND chain.

17. A non-volatile memory system comprising:
a memory circuit formed of an array of one or more blocks of non-volatile memory cells, the block being a minimum erase unit, where each of the blocks includes one or more groups of memory cells;
programming circuitry connectable to the memory array to program multiple subsets of data into a first group of memory cells, each subset of data being provided with an ECC;
logic circuitry, where the logic circuitry is configured to perform processes including:
for each of the blocks, maintaining an experience count indicative of the number of erase-program cycles that the corresponding block has experienced;
maintaining of a file wherein, for at least first and second non-overlapping ranges of experience counts, a corresponding first and second sample of data in a group of previously programmed memory cells is to be selected for a post-write process, wherein the file is configurable so that the first and second samples can be configured independently; and
selecting a sample of the data programmed in the first group of memory cells, the sample being selected from a subset of data said multiple subsets of data programmed into the first group, where selecting a sample includes
determining whether the corresponding experience count for the first group of memory cells corresponds to one of the first or the second non-overlapping ranges of experience counts; and
selecting a sample by the logic circuitry based on the sample corresponding to the determined experience count in the file;
reading circuitry connectable to the memory array to read the selected sample; and
ECC decoding circuitry connectable to the read circuitry to check errors in the selected sample,
wherein the programming circuitry is further connectable to the memory to reprogram said multiple subsets of data into a second group of memory cells whenever the errors checked from the selected sample is more than a predetermined number of error bits.

18. The non-volatile memory system of claim 17, wherein each memory of the cells of the first group stores n bits of data and said programming circuitry programs multiple subsets of data stores n data pages into the first group of memory cells, each data page constituted by one bit from each memory cell in the first group.

19. The non-volatile memory system of claim 18, wherein the first and second samples share elements.

20. The non-volatile memory system of claim 19, wherein the first sample is data corresponding to multiple pages from a first plurality of memory cells and the second sample is data corresponding to single page from the first plurality of memory cells.

21. The non-volatile memory system of claim 20, wherein the second sample is data corresponding to the uppermost page of data from the first plurality of memory cells and the first sample is data corresponding to the uppermost page of data and a middle page of data from the first plurality of memory cells.

22. The non-volatile memory system of claim 18, wherein the first and second samples do not share any elements.

23. The non-volatile memory system of claim 22, wherein the first sample is data corresponding to a first page from a first plurality of memory cells and the second sample is data corresponding to second page from the first plurality of memory cells, the first and second pages being different.

24. The non-volatile memory system of claim 23, wherein the second sample is data corresponding to the uppermost page of data from the first plurality of memory cells.

25. The non-volatile memory system of claim 18, wherein n is equal to 3.

26. The non-volatile memory system of claim 17, wherein the first group of memory cells resides on a word line.

27. The non-volatile memory system of claim 17, wherein the first group forms a block.

28. The non-volatile memory system of claim 17, wherein said ECC decoder checks the ECC of the selected sample to determine the number of error bits.

29. The non-volatile memory system of claim 17, wherein the memory circuit is configured as first and second portions, the first portion having memory cells operating with less error rate but lower density storage compared to the second portion; and wherein:

said first and second groups of memory cells are in the first portion; and said second group of memory cells is in the second portion.

30. The non-volatile memory system of claim 17, wherein the memory circuit is configured as first and second portions, the first portion having memory cells operating with less error rate but lower density storage compared to the second portion; and wherein:

said first group of memory cells is in the first portion; and said second group of memory cells is in the second portion.

31. The non-volatile memory system of claim 17, wherein:

the memory is further organized into multiple rows of NAND chains;

each NAND chain being a column of a string of daisy-chained memory cells terminating at a source terminal and a drain terminal; and the selected sample is a subset of data stored at memory cells closest to the source terminal of each NAND chain.

32. The non-volatile memory system of claim 17, wherein:

the memory is further organized into multiple rows of NAND chains;

each NAND chain being a column of a string of daisy-chained memory cells terminating at a source terminal and a drain terminal; and the selected sample is a subset of data stored at memory cells closest to the drain terminal of each NAND chain.

* * * * *